United States Patent
Inoue et al.

(10) Patent No.: US 8,520,457 B2
(45) Date of Patent: *Aug. 27, 2013

(54) SEMICONDUCTOR DEVICE

(75) Inventors: Takayuki Inoue, Atsugi (JP); Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/359,534

(22) Filed: Jan. 27, 2012

(65) Prior Publication Data
US 2012/0120742 A1 May 17, 2012

Related U.S. Application Data

(63) Continuation of application No. 12/850,736, filed on Aug. 5, 2010, now Pat. No. 8,111,567, and a continuation of application No. 12/000,592, filed on Dec. 14, 2007, now Pat. No. 7,773,436.

(30) Foreign Application Priority Data

Dec. 26, 2006 (JP) .................................. 2006-349191

(51) Int. Cl.
*G11C 7/00* (2006.01)
(52) U.S. Cl.
USPC ................. 365/200; 365/189.011; 365/230.06
(58) Field of Classification Search
USPC .............. 365/200, 189.011, 230.06, 226, 201
See application file for complete search history.

(56) References Cited

U.S. PATENT DOCUMENTS

| | | | |
|---|---|---|---|
| 4,937,790 | A | 6/1990 | Sasaki et al. |
| 4,942,556 | A | 7/1990 | Sasaki et al. |
| 5,278,839 | A | 1/1994 | Matsumoto et al. |
| 5,402,377 | A | 3/1995 | Ohhata et al. |
| 5,452,251 | A | 9/1995 | Akaogi et al. |
| 5,621,683 | A | 4/1997 | Young |

(Continued)

FOREIGN PATENT DOCUMENTS

| | | |
|---|---|---|
| EP | 0242854 A | 10/1987 |
| JP | 62-250599 A | 10/1987 |

(Continued)

OTHER PUBLICATIONS

"Eight Character 5.0 mm (0.2 inch) Glass/Ceramic Intelligent 5 × 7 Alphanumeric Displays for Military Applications," Technical Data, pp. 1-16.

(Continued)

*Primary Examiner* — David Lam
(74) *Attorney, Agent, or Firm* — Eric J. Robinson; Robinson Intellectual Property Law Office, P.C.

(57) ABSTRACT

An object is to provide a semiconductor device having a memory which can efficiently improve a yield by employing a structure which facilitates the use of a spare memory cell. The semiconductor device includes a memory cell array having a memory cell and a spare memory cell, a decoder connected to the memory cell and the spare memory cell, a data holding circuit connected to the decoder, and a battery which supplies electric power to the data holding circuit. The spare memory cell operates in accordance with an output from the data holding circuit.

19 Claims, 13 Drawing Sheets

(56) References Cited

U.S. PATENT DOCUMENTS

| | | |
|---|---|---|
| 5,929,778 A | 7/1999 | Asama et al. |
| 6,041,000 A | 3/2000 | McClure et al. |
| 6,215,704 B1 | 4/2001 | Shimizu |
| 6,284,406 B1 | 9/2001 | Xing et al. |
| 6,362,502 B1 | 3/2002 | Rosner et al. |
| 6,525,976 B1 | 2/2003 | Johnson |
| 6,563,749 B2 | 5/2003 | Ferrant |
| 6,563,759 B2 | 5/2003 | Yahata et al. |
| 6,577,534 B2 | 6/2003 | Tsuruda |
| 6,611,458 B2 * | 8/2003 | Ishibashi et al. ......... 365/185.09 |
| 6,819,604 B2 | 11/2004 | Yamada |
| 6,865,098 B1 * | 3/2005 | Ichiriu et al. .................. 365/200 |
| 6,879,529 B2 | 4/2005 | Yamada |
| 6,967,878 B2 | 11/2005 | Dono |
| 7,030,714 B2 | 4/2006 | Korol |
| 7,187,607 B2 * | 3/2007 | Koshikawa .................. 365/222 |
| 7,239,564 B2 | 7/2007 | Mutaguchi |
| 7,294,209 B2 | 11/2007 | Shakespeare |
| 7,719,872 B2 | 5/2010 | Kato |
| 7,773,436 B2 * | 8/2010 | Inoue et al. .................. 365/200 |
| 7,816,721 B2 | 10/2010 | Yamazaki et al. |

FOREIGN PATENT DOCUMENTS

| | | |
|---|---|---|
| JP | 01-133298 A | 5/1989 |
| JP | 01-269299 A | 10/1989 |
| JP | 03-150797 A | 6/1991 |
| JP | 04-064999 A | 2/1992 |
| JP | 04-228196 A | 8/1992 |
| JP | 06-036592 A | 2/1994 |
| JP | 08-138018 A | 5/1996 |
| JP | 09-128991 A | 5/1997 |
| JP | 2001-135084 A | 5/2001 |
| JP | 2002-025255 A | 1/2002 |
| JP | 2003-051199 A | 2/2003 |
| JP | 2005-174533 A | 6/2005 |
| JP | 2005-209492 A | 8/2005 |

OTHER PUBLICATIONS

Hara, "2.6.4. Memory circuit: static RAM," VLSI Introductory Series 5 on VLSI, Basics of MOS Integrated Circuits, May 30, 1992, pp. 61-66, First Edition, Kindai Kagaku sha Co., Ltd.

* cited by examiner

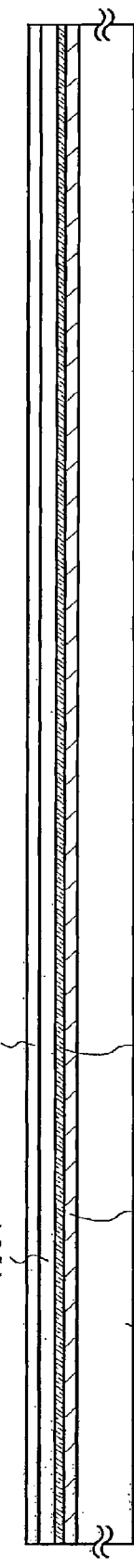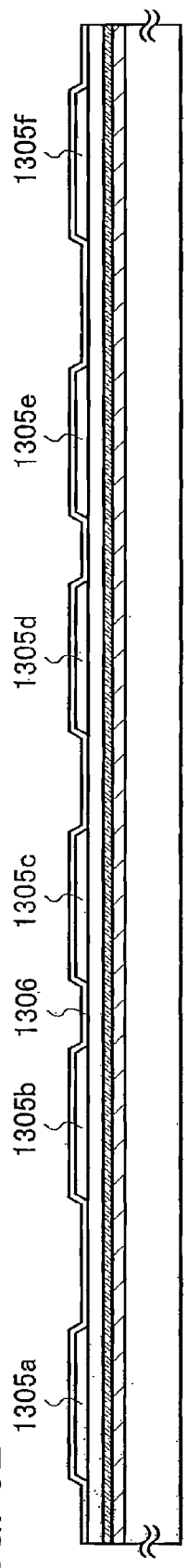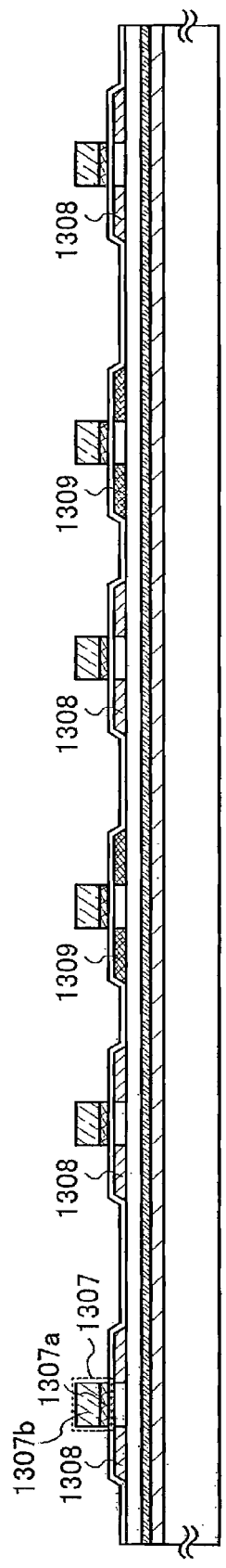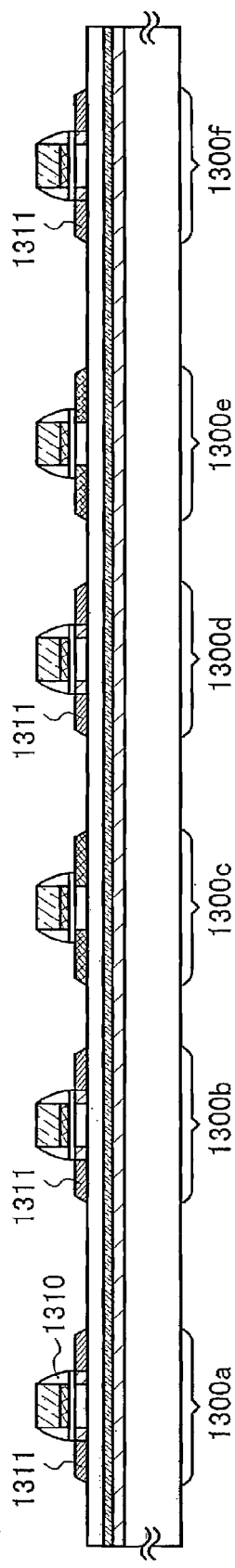

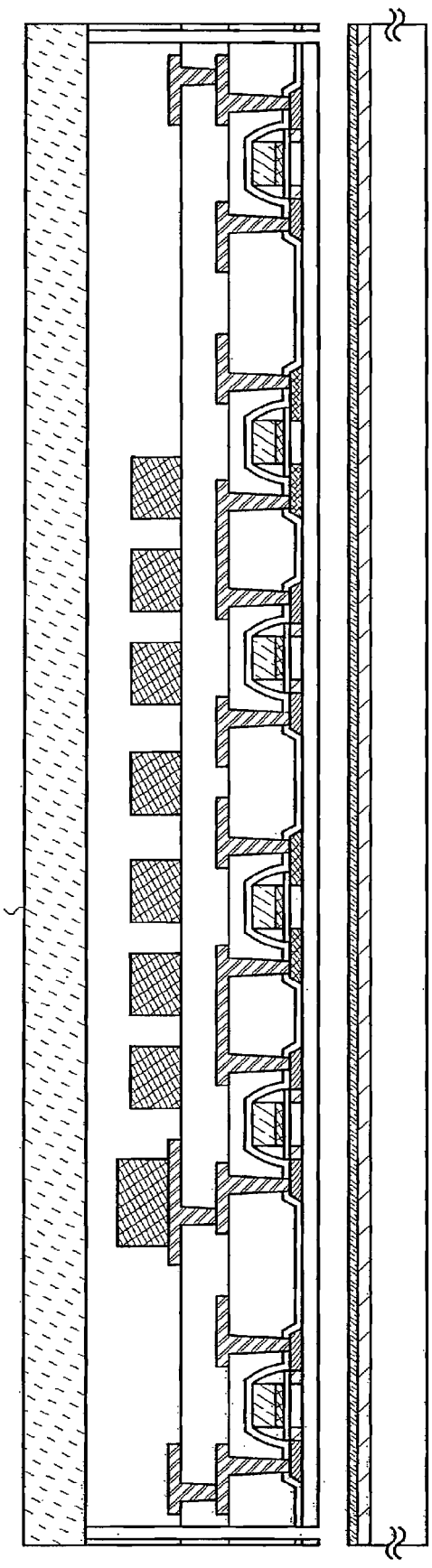
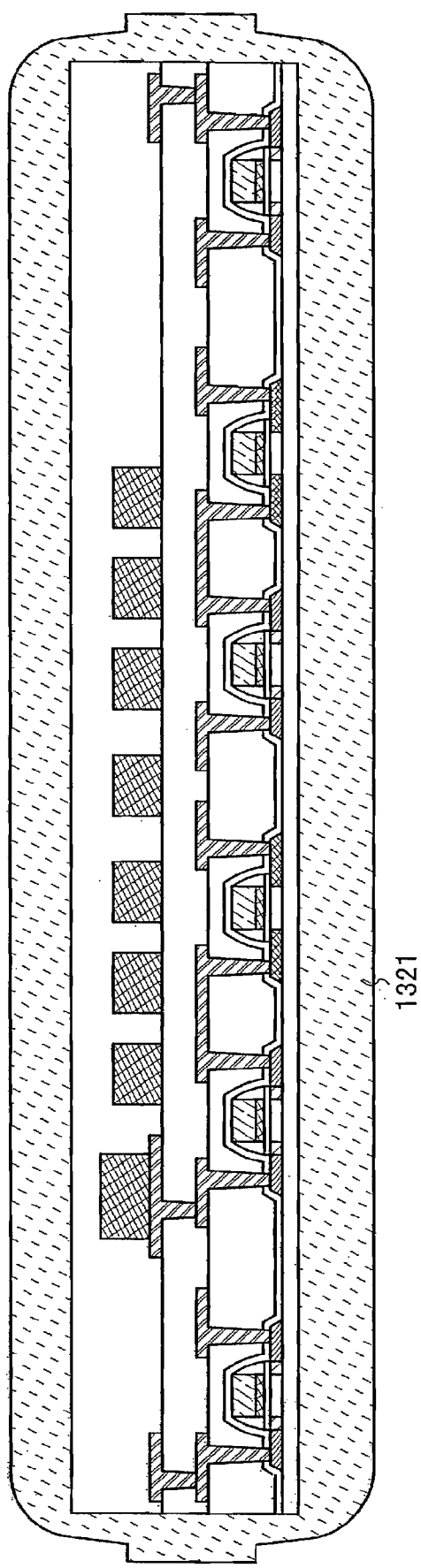
FIG. 8A
FIG. 8B

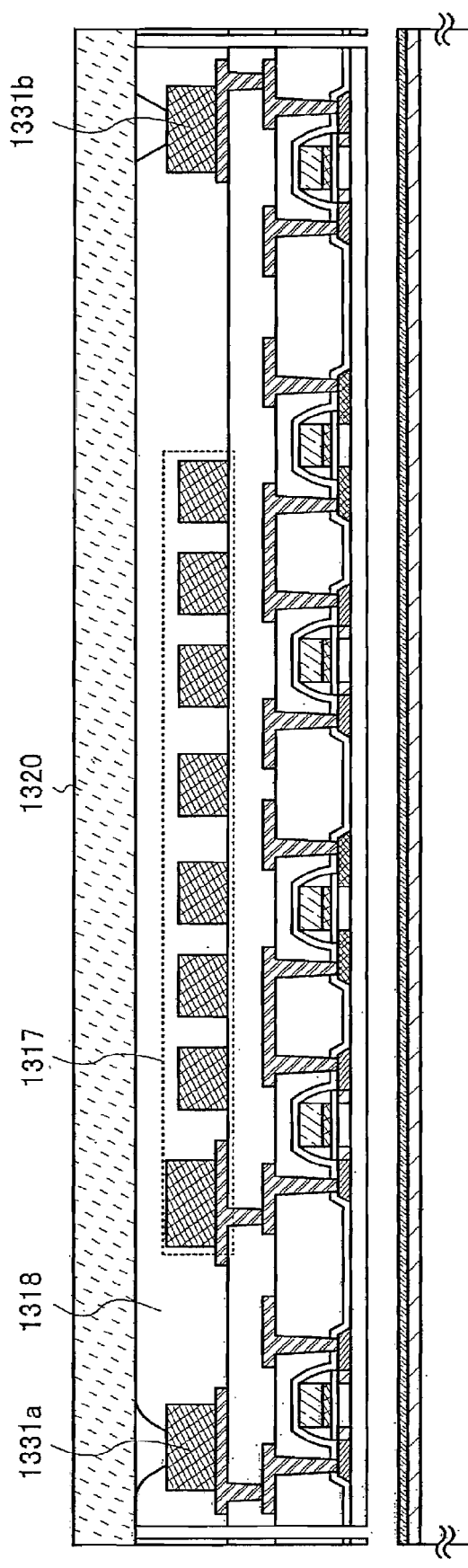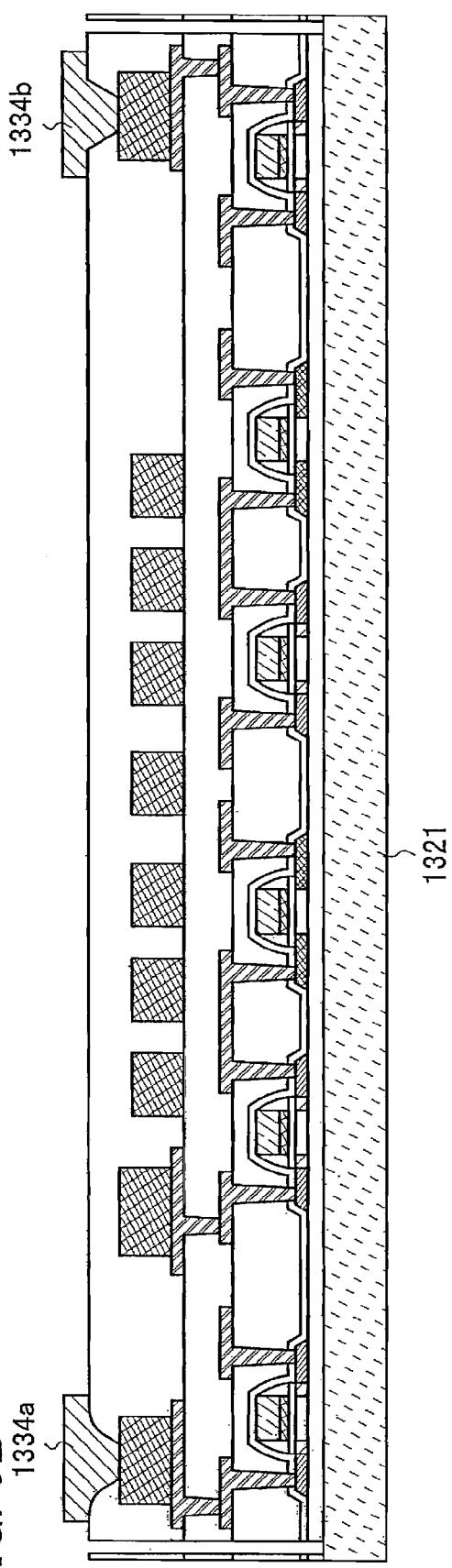

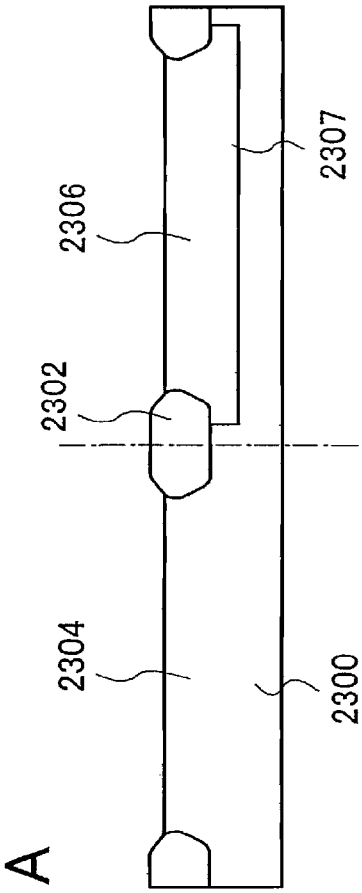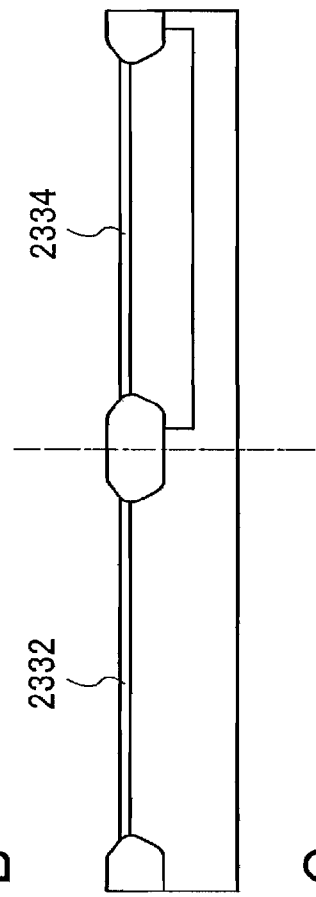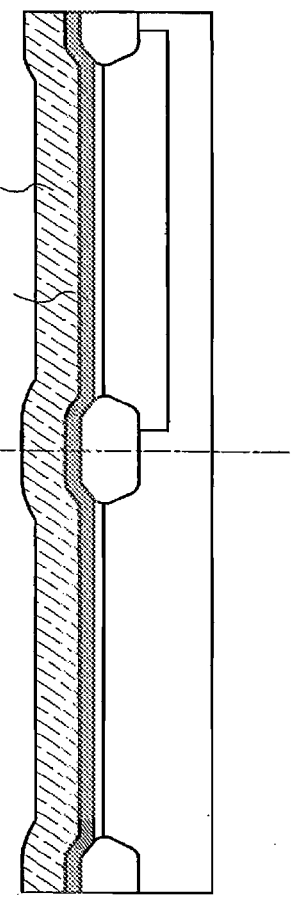

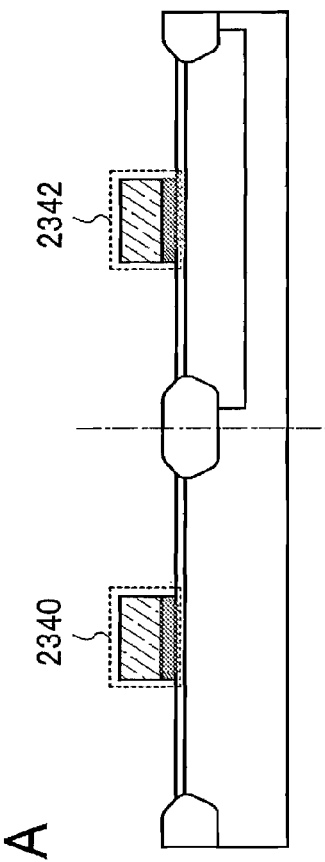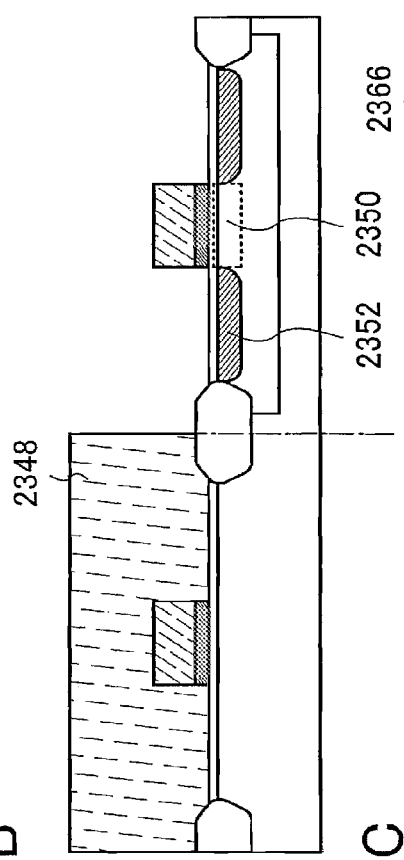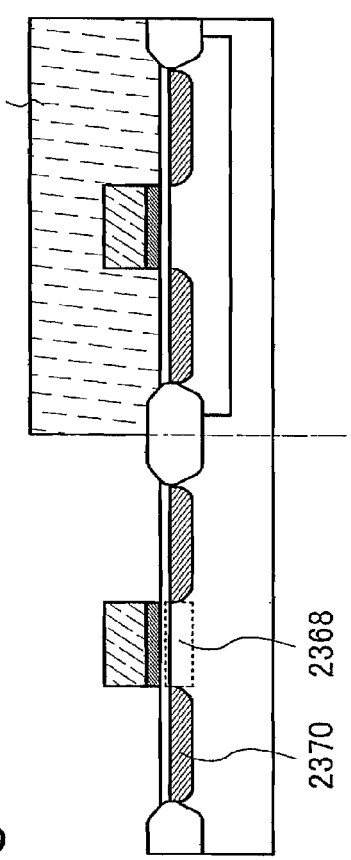

SEMICONDUCTOR DEVICE

BACKGROUND OF THE INVENTION

1. Field of the Invention

The present invention relates to a semiconductor device. The present invention particularly relates to a semiconductor device having a memory.

2. Description of the Related Art

For a semiconductor device having a memory, the performance of the memory is very important in determining the performance of the semiconductor device. For example, in a semiconductor device having a CPU and a memory, instructions to be processed by the CPU and data necessary for the processing need to be stored in the memory. Also, the processing by the CPU proceeds by sequential reading of the data from the memory. In other words, in order to perform accurate processing, there should not be even a single defective memory cell. Therefore, in order to improve the yield of a semiconductor device, it is often the case that a spare memory cell is provided in advance (for example, Reference 1: Hisashi Hara, "VLSI Introductory Series 5, Basics of MOS Integrated Circuits", First Edition, Kindai Kagaku sha Co., Ltd., May 1992, pp. 61-66). A spare memory cell refers to a circuit which is used instead when there is a defective memory cell, which can improve the yield of a semiconductor device.

However, the use of a spare memory cell requires the blowing of three fuses as described in Reference 1. One of the fuses needs to be blown to make a word line connected to a defective bit unusable, and the other two need to be blown to make the potential of a spare word line "high". As a result, the blowing of fuses takes time, and when a large number of fuses need to be blown, the time required becomes inconvenient. Furthermore, when a plurality of spare memory cells are provided, blowing fuses takes an enormous amount of time.

SUMMARY OF THE INVENTION

In view of the above-mentioned problem, it is an object of the present invention to provide a semiconductor device having a memory which can efficiently improve a yield by employing a structure which facilitates the use of a spare memory cell.

The semiconductor device according to the present invention stores the address of a defective bit and information about whether or not to drive a spare memory cell in a data holding circuit which is backed up by a battery. With the use of the information stored in the data holding circuit, it becomes unnecessary to cut a wiring and it becomes possible to use a spare memory cell only by an electric signal. Hereinafter, a specific structure thereof is described.

A feature of the semiconductor device of the present invention is to include a memory cell array having a memory cell and a spare memory cell, a driver circuit such as a decoder connected to the memory cell and the spare memory cell, a data holding circuit connected to the decoder, and a battery which supplies electric power to the data holding circuit. The spare memory cell operates in accordance with an output from the data holding circuit.

Another feature of the semiconductor device of the present invention is to include a memory cell array having a memory cell and a spare memory cell, a decoder connected to the memory cell through a word line and connected to the spare memory cell through a spare memory word line, a read/write circuit connected to the memory cell and the spare memory cell through a bit line, a data holding circuit connected to the decoder, and a battery which supplies electric power to the data holding circuit. The spare memory cell operates in accordance with an output from the data holding circuit.

The battery in the semiconductor device of the present invention may have an antenna circuit and a power storage circuit and may be configured to charge the power storage circuit with electric power received wirelessly through the antenna circuit from the outside.

With such a structure as described above, it is possible to provide a semiconductor device having a memory which facilitates the use of a spare memory cell.

An aspect of the present invention disclosed by this specification is a semiconductor device including a battery, a data holding circuit, a decoder, a word line, a spare word line, a memory cell, a spare memory cell, a bit line, and a read/write circuit, a feature of which is to have a function for facilitating the use of the spare memory cell when the memory cell is defective.

The present invention can significantly reduce trouble that occurs in using a spare memory cell. In other words, the present invention can be expected to efficiently improve a yield. With such a memory, a semiconductor device with high yield can be provided.

BRIEF DESCRIPTION OF THE DRAWINGS

FIGS. 6A to 6D show an example of a manufacturing method of a semiconductor device of the present invention.

FIGS. 8A and 8B show an example of a manufacturing method of a semiconductor device of the present invention.

FIGS. 9A and 9B show an example of a manufacturing method of a semiconductor device of the present invention.

FIGS. 11A to 11C show an example of a manufacturing method of a semiconductor device of the present invention.

FIGS. 12A to 12C show an example of a manufacturing method of a semiconductor device of the present invention.

DETAILED DESCRIPTION OF THE INVENTION

Figure 1:
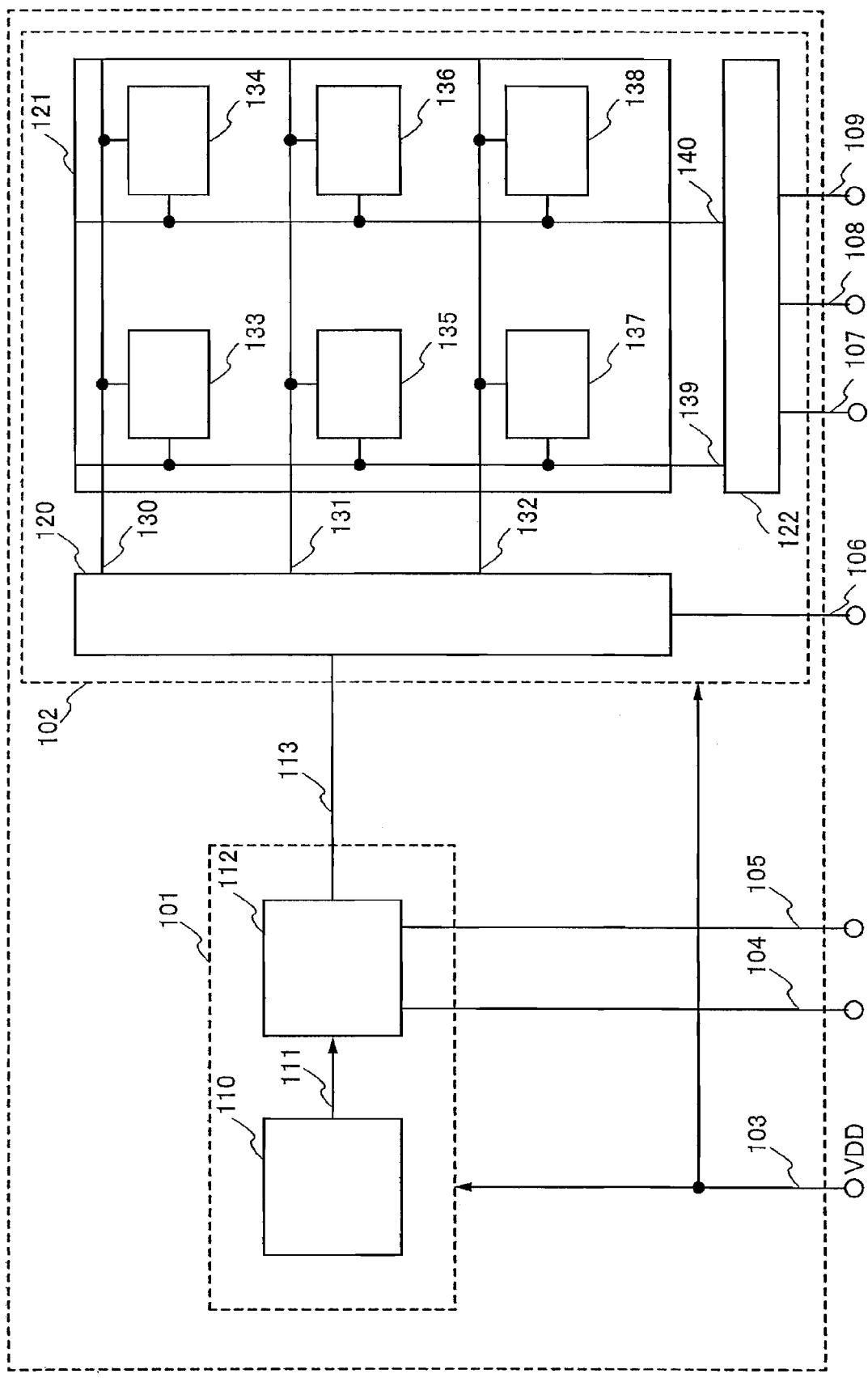
FIG. 1 is a diagram showing an example of a structure of a semiconductor device of the present invention.

Embodiment modes of the present invention are hereinafter described with reference to the accompanying drawings. Note that the present invention can be carried out in many different modes, and it is to be easily understood by those skilled in the art that the mode and detail of the present invention can be modified in various ways without departing from the spirit and scope of the present invention. Therefore, the present invention should not be interpreted as being limited to the description of the embodiment modes. Note that in the drawings for illustrating the embodiment modes, the same portions or portion having similar functions are denoted by the same reference numerals, and repetitive description thereof is omitted.

Embodiment Mode 1

A semiconductor device to be described in this embodiment mode has a structure in which a data holding circuit which is backed-up by a battery stores the address of a defective bit and information about whether or not to drive a spare memory cell and the use of the spare memory cell is enabled by an electric signal. Hereinafter, the semiconductor device of this embodiment mode is described with reference to FIG. 1. FIG. 1 is a block diagram showing a structure of the semiconductor device of the present invention.

The semiconductor device of this embodiment mode has a battery backed-up circuit portion 101 and a memory circuit portion 102. The battery backed-up circuit portion 101 includes a battery 110 and a data holding circuit 112. The memory circuit portion 102 includes a decoder 120, a memory cell array 121, and a read/write circuit 122. The memory cell array 121 is provided with a first spare memory cell 133, a second spare memory cell 134, and first to fourth memory cells 135 to 138. The battery backed-up circuit portion 101 and the memory circuit portion 102 are connected to a first power supply line 103 and supplied with electric power from the first power supply line 103. Note that although the description below is made taking as an example a case where a 4-bit SRAM is provided as the memory circuit portion 102, the structure of the memory circuit portion 102 is not limited to this.

Next, specific structures of the battery backed-up circuit portion 101 and the memory circuit portion 102 are described.

First, a specific structure of the battery backed-up circuit portion 101 is described.

The battery 110 supplies electric power to the data holding circuit 112 through a second power supply line 111. Therefore, even if the supply of electric power from the first power supply line 103 to the data holding circuit 112 is stopped, information stored in the data holding circuit 112 can be held by power supply from the battery 110.

The data holding circuit 112 is connected to a first wiring 104, a second wiring 105, and a third wiring 113. The first wiring 104 is a wiring to transmit information about whether or not to use the first spare memory cell 133 and the second spare memory cell 134 to the data holding circuit 112, and may be referred to as a control signal line. The second wiring 105 is a wiring to transmit signals for controlling the timing of writing the information to the data holding circuit 112, and may be referred to as a holding circuit write enable signal line. The third wiring 113 is a wiring to transmit the information held from the data holding circuit 112 to the decoder 120, and may be referred to as a data signal line.

Alternatively, the battery backed-up circuit portion 101 can have a structure in which the data holding circuit 112 is supplied with electric power through both the first power supply line 103 and the second power supply line 111. The information held by the data holding circuit 112 is transmitted to the decoder 120 through the third wiring 113. The information held by the data holding circuit 112 refers to information concerning whether or not to use a spare memory cell (here, the first spare memory cell 133 and the second memory cell 134) and for which address the spare memory cell is used. The information is transmitted to the data holding circuit 112 from the outside through the first wiring 104. Data is written to the data holding circuit 112 when the potential of the second wiring 105 is "high", and data held by the data holding circuit 112 does not change when the potential of the second wiring 105 is "low". Note that the writing of information about a defective bit to the data holding circuit 112 can be performed at any time. For example, when a defective bit is detected at the time of inspection in a manufacturing process of a semiconductor memory device or during use of a semiconductor memory device, information about the defective bit can be written to the data holding circuit 112.

Next, a specific structure of the memory circuit portion 102 is described.

The memory cell array 121 has the first to fourth memory cells 135 to 138, the first spare memory cell 133, and the second spare memory cell 134, each of which stores 1-bit data. The first memory cell 135 is connected to a first word line 131 and a first bit line 139; the second memory cell 136 is connected to the first word line 131 and a second bit line 140; the third memory cell 137 is connected to a second word line 132 and the first bit line 139; and the fourth memory cell 138 is connected to the second word line 132 and the second bit line 140. The first spare memory cell 133 is connected to a spare memory word line 130 and the first bit line 139, and the second spare memory cell 134 is connected to the spare memory word line 130 and the second bit line 140. If the potential of the first word line 131 is "high", the first memory cell 135 and the second memory cell 136 are driven; if the potential of the second word line 132 is "high", the third memory cell 137 and the fourth memory cell 138 are driven; and if the potential of the spare memory word line 130 is "high", the first spare memory cell 133 and the second spare memory cell 134 are driven.

Figure 4A:
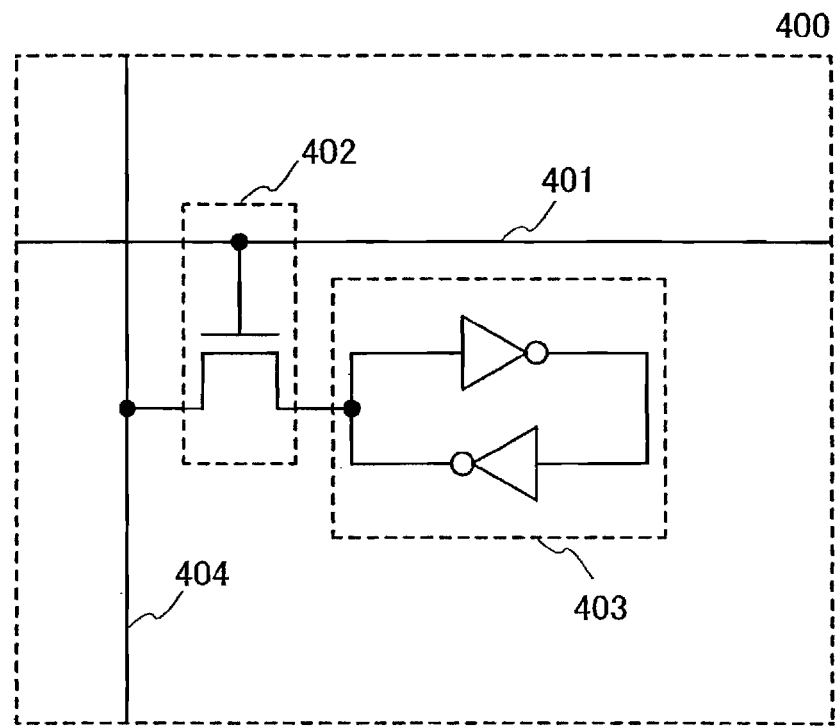
FIGS. 4A and 4B are diagrams each showing a structure example of a memory cell of a semiconductor device of the present invention.
Figure 4B:
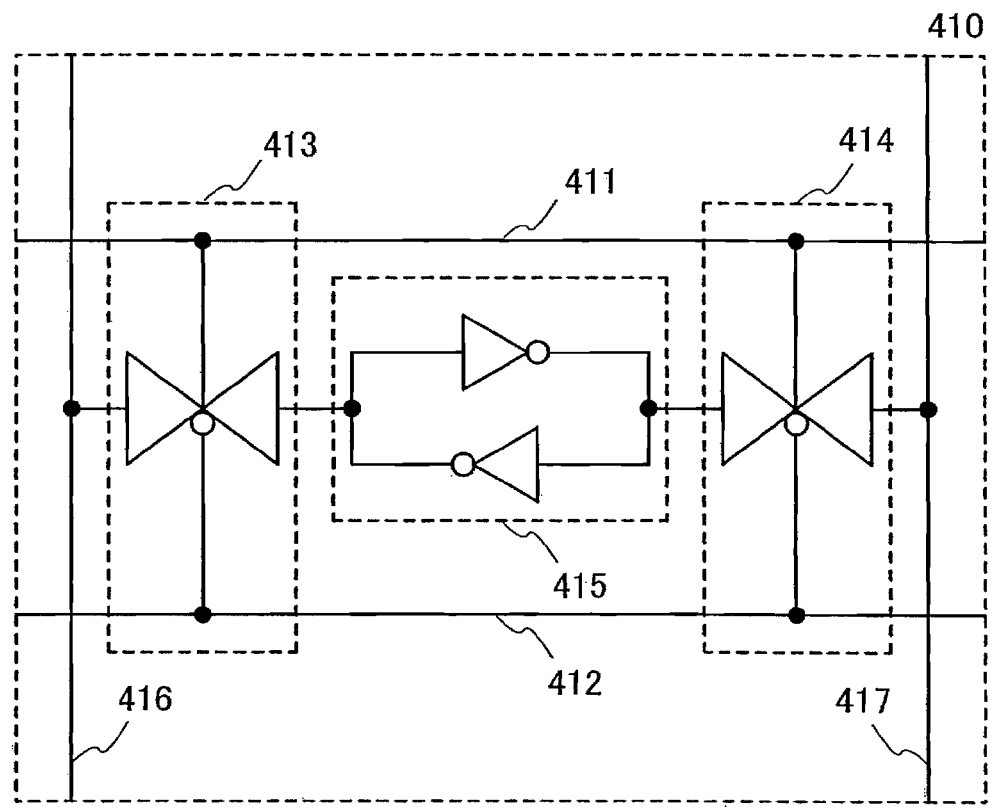

Structures shown in FIGS. 4A and 4B are given as examples of the structure of each of the first to fourth memory cells 135 to 138, the first spare memory cell 133, and the second spare memory cell 134. Each of FIGS. 4A and 4B is an example of a specific circuit structure of an SRAM cell. A memory cell 400 shown in FIG. 4A includes a word line 401, an n-channel transistor 402, a latch 403, and a bit line 404. A memory cell 410 shown in FIG. 4B includes a word line 411, an inverted word line 412, a first analog switch 413, a second analog switch 414, a latch 415, a bit line 416, and an inverted bit line 417. In the memory cell 400, the n-channel transistor 402 may be replaced by an analog switch. In the memory cell 410, the first analog switch 413 and the second analog switch 414 may each be replaced by an n-channel transistor or a p-channel transistor. Note that an example of the memory circuit is not limited to an SRAM, and a DRAM or the like can be alternatively used.

The read/write circuit 122 is connected to the first bit line 139, the second bit line 140, an input/output signal line 107, a memory write enable signal line 108, and a read enable signal line 109. The read/write circuit 122 reads and writes the memory cells through the first bit line 139 and the second bit line 140. The timing of reading and writing is controlled by the memory write enable signal line 108 and the read enable signal line 109. A memory cell to be read and written corresponds to a memory cell which is driven with the potential of the word line "high". An input signal of write data from the outside and an output signal of read data to the outside are transmitted through the input/output signal line 107.

The read/write circuit 122 performs a write operation to a memory cell when the potential of the memory write enable signal line 108 is "high" and the potential of the read enable signal line 109 is "low". A memory cell to be written is determined depending on the potential of an address signal line 106 and the potential of the third wiring 113. In addition, the read/write circuit 122 performs a read operation to a memory cell when the potential of the memory write enable signal line 108 is "low" and the potential of the read enable signal line 109 is "high". A memory cell to be read is determined depending on the potential of the address signal line 106 and the potential of the third wiring 113. When the potential of the memory write enable signal line 108 and that of the read enable signal line 109 are both "low", no operation is performed to the memory cells. The read/write circuit 122 is preferably configured not to perform an input by which the potential of the memory write enable signal line 108 and that of the read enable signal line 109 both become "high" because such an input causes malfunction.

The decoder 120 is connected to the third wiring 113, the address signal line 106, the spare memory word line 130, the first word line 131, and the second word line 132. The decoder 120 decodes address information and information about the spare memory cell which are transmitted through the address signal line 106 and the third wiring 113, respectively. Through decoding, the potential of one of the first word line 131, the second word line 132, and the spare memory word line 130 becomes "high", and the potentials of the other two lines are maintained "low".

Next, a specific format of the information held by the data holding circuit 112 is described. Here, the data holding circuit 112 holds 2-bit data (first data and second data). In other words, the third wiring 113 serves as a 2-bit signal line. The first data refers to data concerning whether or not to use a spare memory cell (here, the first spare memory cell 133 and the second spare memory cell 134). When the first data is "1", the spare memory cell is used. When the first data is "0", the spare memory cell is not used. The first data is transmitted as a first bit through the third wiring 113. If the first data is "1", the first bit is "1". If the first data is "0", the first bit is "0". The second data refers to data concerning for which address the spare memory cell is used. If the second data is "1", the spare memory cell is used when the potential of the address signal line 106 is "high". If the second data is "0", the spare memory cell is used when the potential of the address signal line 106 is "low". The second data is transmitted as a second bit through the third wiring 113. If the second data is "1", the second bit is "1". If the second data is "0", the second bit is "0".

In FIG. 1, the address signal line 106 transmits 1 bit, so that it is only necessary for the data holding circuit 112 to hold 2-bit data. If the address signal line 106 transmits n bits (n is a natural number), the data holding circuit 112 needs to hold (n+1)-bit data.

The normal operation of the memory circuit portion 102, in other words, the operation when the spare memory cell is not used is described. First, after it is confirmed by inspection that there is no defective memory cell, the information that the spare memory cell is not to be used is written to the data holding circuit 112. In other words, the first data is "0". The second data may be either one. These data are transmitted to the decoder 120 through the third wiring 113. In other words, the first bit transmitted through the third wiring 113 is "0", and the second bit is "0" or "1". The logic of the decoder 120 is designed so as not to use the spare memory cell if the first bit transmitted through the third wiring 113 is "0".

Here, the logic of the decoder 120 about the address signal line 106 is set so that the potential of the first word line 131 becomes "high" when the potential of the address signal line 106 is "low" and the potential of the second word line 132 becomes "high" when the potential of the address signal line 106 is "high".

When the potential of the first word line 131 is "high" (when the potential of the address signal line 106 is "low"), the first memory cell 135 and the second memory cell 136 are driven. When the potential of the second word line 132 is "high" (when the potential of the address signal line 106 is "high"), the third memory cell 137 and the fourth memory cell 138 are driven.

If the potential of the first word line 131 is "high" and the potential of the memory write enable signal line 108 is "high", a write operation is performed to the first memory cell 135 and the second memory cell 136. If the potential of the first word line 131 is "high" and the potential of the read enable signal line 109 is "high", a read operation is performed to the first memory cell 135 and the second memory cell 136. If the potential of the second word line 132 is "high" and the potential of the memory write enable signal line 108 is "high", a write operation is performed to the third memory cell 137 and the fourth memory cell 138. If the potential of the second word line 132 is "high" and the potential of the read enable signal line 109 is "high", a read operation is performed to the third memory cell 137 and the fourth memory cell 138.

Next, the operation when a defective memory cell is generated is described. Here, it is assumed that the first memory cell 135 is defective.

First, after it is confirmed by inspection that the first memory cell 135 is defective, the information that the spare memory cell is to be used is written to the data holding circuit 112. In other words, the first data is "1", and the second data is "0". These data are transmitted to the decoder 120 through the third wiring 113. In other words, the first bit transmitted through the third wiring 113 is "1", and the second bit is "0". The logic of the decoder 120 is designed so as to use the spare memory cell if the first bit transmitted through the third wiring 113 is "1". In addition, the logic of the decoder 120 is designed so that if the second bit transmitted through the third wiring 113 is "0", the spare memory cell is used when the potential of the address signal line 106 is "low", and if the second bit transmitted through the third wiring 113 is "1", the spare memory cell is used when the potential of the address signal line 106 is "high".

Here, the logic of the decoder 120 about the address signal line 106 is set so that the potential of the spare memory word line 130 becomes "high" when the potential of the address signal line 106 is "low" and the potential of the second word line 132 becomes "high" when the potential of the address signal line 106 is "high".

When the potential of the spare memory word line 130 is "high", the first spare memory cell 133 and the second spare memory cell 134 are driven. When the potential of the second word line 132 is "high", the third memory cell 137 and the fourth memory cell 138 are driven.

If the potential of the spare memory word line 130 is "high" and the potential of the memory write enable signal line 108 is "high", a write operation is performed to the first spare memory cell 133 and the second spare memory cell 134. If the potential of the spare memory word line 130 is "high" and the potential of the read enable signal line 109 is "high", a read operation is performed to the first spare memory cell 133 and the second spare memory cell 134. If the potential of the second word line 132 is "high" and the potential of the memory write enable signal line 108 is "high", a write operation is performed to the third memory cell 137 and the fourth memory cell 138. If the potential of the second word line 132 is "high" and the potential of the read enable signal line 109 is "high", a read operation is performed to the third memory cell 137 and the fourth memory cell 138. The operation of the memory circuit portion 102 when a defective memory cell is generated is described so far.

In the circuit structure of FIG. 1, when the first spare memory cell 133 is used, the second spare memory cell 134 is used instead of the second memory cell 136 even if the second memory cell 136 is not defective. In other words, if one of the first memory cell 135 and the second memory cell 136 is defective, "0" is written as the second data to the data holding circuit 112. If one of the third memory cell 137 and the fourth memory cell 138 is defective, "1" is written as the second data to the data holding circuit 112.

With such a structure, when the first memory cell 135 is defective, the first spare memory cell 133 can be used instead of the first memory cell 135. The same applies to each case where the second memory cell 136, the third memory cell 137, or the fourth memory cell 138 is defective, so the description is omitted.

With such a structure as described above, it is possible to provide a semiconductor device having a memory which has a function to facilitate the use of a spare memory cell. In other words, it is possible to efficiently improve a yield. With such a memory, it is possible to provide a semiconductor device with high yield.

Embodiment Mode 2

Figure 2A:
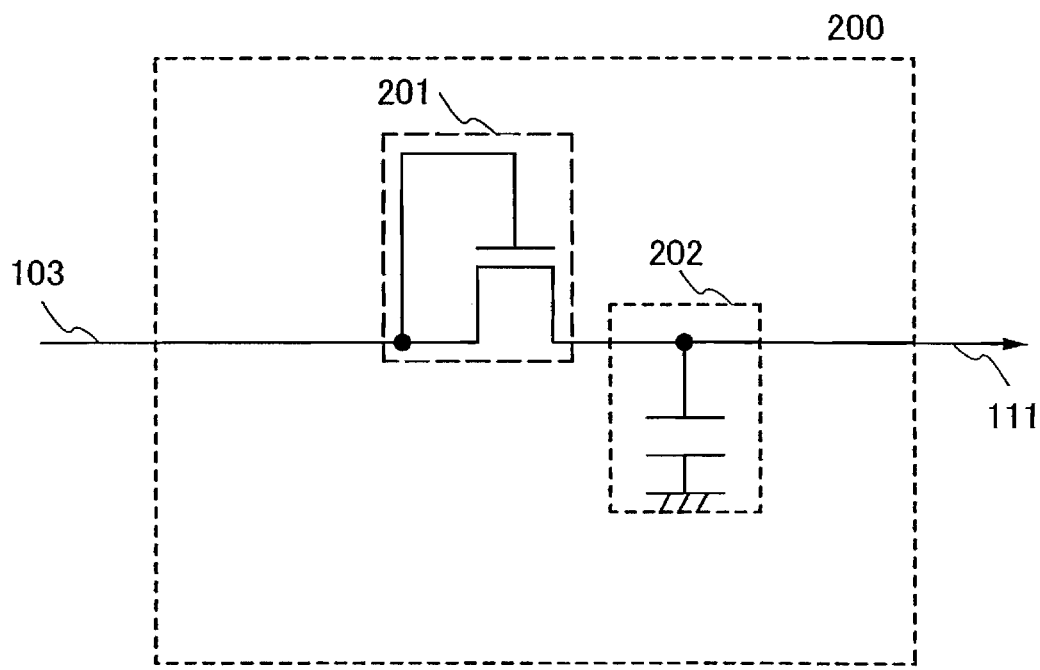
FIGS. 2A and 2B are diagrams each showing a structure example of a battery of a semiconductor device of the present invention.
Figure 2B:
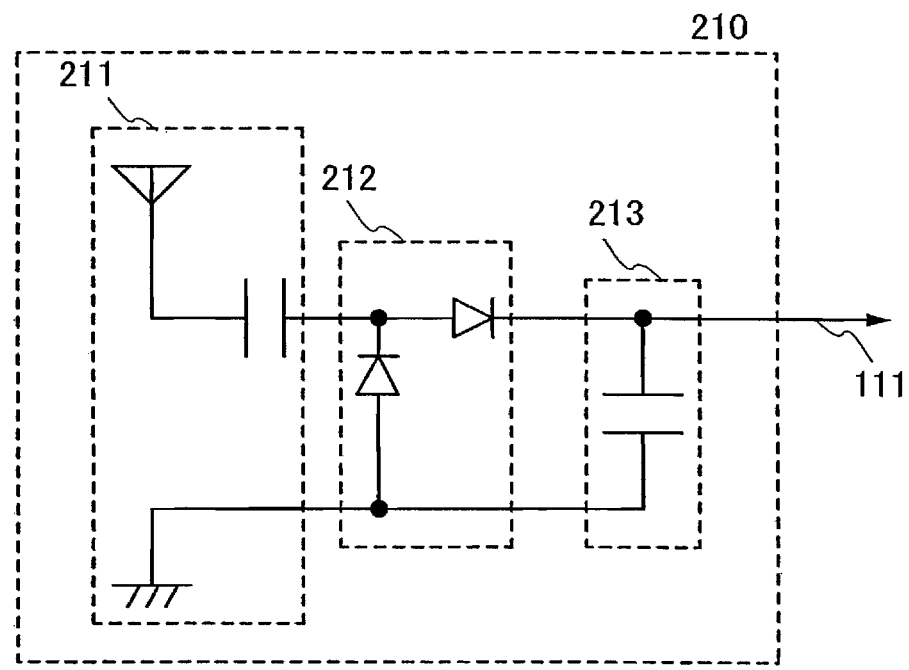

This embodiment mode describes a structure of the battery provided in the battery backed-up circuit portion of the semiconductor device described in Embodiment Mode 1, with reference to FIGS. 2A and 2B. Each of FIGS. 2A and 2B is an example of a specific circuit structure of the battery 110. The battery 110 is a circuit to supply electric power to the data holding circuit 112.

A battery 200 shown in FIG. 2A includes a rectifying element 201 and a power storage circuit 202. Here, the case where the rectifying element 201 is a diode-connected n-channel (Nch) transistor is described, but the rectifying element 201 may be any element having a rectifying function, such as a PN diode, a PIN diode, a Schottky diode, a metal-insulator-metal (MIM) diode, or a metal-insulator-semiconductor (MIS) diode.

The power storage circuit 202 may be provided with a means capable of restoring electric power by charging (a power storage means). Note that examples of the power storage means are a secondary battery, a capacitor, and the like. Specifically, the power storage means used is preferably a battery formed in a sheet-like form, although the type of the power storage means used may differ depending on an intended use. For example, by using a lithium battery, preferably a lithium polymer battery that uses a gel electrolyte, a lithium ion battery, or the like, a reduction in size is possible. Needless to say, any battery may be used as long as it is chargeable. For example, the following batteries that are chargeable and dischargeable can be used: a nickel metal hydride battery, a nickel cadmium battery, an organic radical battery, a lead-acid battery, an air secondary battery, a nickel-zinc battery, a silver-zinc battery, and the like. Alternatively, a capacitor with high capacitance or the like may be used.

Note that as a capacitor with high capacitance that can be used as the power storage means, it is preferable to use a capacitor having electrodes whose opposed areas are large. It is preferable to use an electric double-layer capacitor which is formed from an electrode material having a large specific surface area such as activated carbon, fullerene, or a carbon nanotube. A capacitor has a simpler structure than a battery. Further, a capacitor can be easily formed to be thin and formed by stacking layers. An electric double-layer capacitor has a function of storing electric power and does not deteriorate much even after it is charged and discharged a number of times. Further, the electric double-layer capacitor has an excellent property in that it can be charged rapidly.

In FIG. 2A, the battery 200 can have a structure in which an input portion of the rectifying element 201 (here, a gate and one of a source and a drain of a transistor) is connected to the first power supply line 103 and one electrode of the power storage circuit 202 is connected to the second power supply line 111.

In the state where the potential of the first power supply line 103 is "high", the Nch transistor that is the rectifying element 201 is turned on, and the power storage circuit 202 is charged with electric charges. The potential of the second power supply line 111 continues to be "high" as long as the potential of the first power supply line 103 continues to be "high". In the case where the potential of the first power supply line 103 becomes "low", the Nch transistor is turned off. However, because charges are accumulated in the power storage circuit 202, the potential of the second power supply line 111 continues to be "high". By using the power storage circuit 202 having high capacitance, the potential of the second power supply line 111 can continue to be "high" for a sufficiently long time. With such a structure as described above, a function as a battery can be obtained.

In addition, the structure of the battery is not limited to FIG. 2A. For example, the battery can have a structure shown in FIG. 2B.

A battery 210 shown in FIG. 2B has a circuit which generates electric power using a wireless signal, and is referred to as an RF battery. The battery 210 (hereinafter referred to as "RF battery 210") includes an antenna circuit 211, a rectifying circuit 212, a power storage circuit 213, and the second power supply line 111. The power storage circuit 213 functions to hold the potential of the second power supply line 111 "high" and to smooth a voltage. Hereinafter, a method for charging the RF battery 210 and supplying electric power stored in the RF battery 210 is described.

The RF battery 210 can generate a power supply voltage from electromagnetic waves. The antenna circuit 211 can generate a power supply voltage by detecting a signal in a frequency band in accordance with the shape of the antenna, generating an AC signal, and converting the AC signal into a DC voltage by the rectifying circuit.

For the electromagnetic waves received by the antenna circuit 211, electromagnetic waves emitted from a power feeder which emits electromagnetic waves with a specified wavelength may be used, and electromagnetic waves generated at random outside may also be used. The power feeder may be any device which emits electromagnetic waves with a specified wavelength, and preferably emits electromagnetic waves with a wavelength such that they are easily received by an antenna provided in the antenna circuit. Examples of electromagnetic waves which are generated at random outside are as follows: electromagnetic waves from a cellular phone relay station (a 800 to 900 MHz band, 1.5 GHz, a 1.9 to 2.1 GHz band, or the like), electromagnetic waves emitted from a cellular phone, electromagnetic waves from a radio controlled clock (40 kHz or the like), noise from a household AC power supply (60 Hz or the like), and the like.

In the case of using a power feeder, a transmission method for electromagnetic waves that is applied between the antenna circuit 211 and the power feeder can be an electromagnetic coupling method, an electromagnetic induction method, an electric field method, or the like. The transmission method may be selected as appropriate by a practitioner of the invention in consideration of an intended use. An antenna with a length and shape which are suitable for the transmission method may be provided.

For example, in the case where an electromagnetic coupling method or an electromagnetic induction method (e.g., a 13.56 MHz band) is employed as a transmission method, because electromagnetic induction caused by changes in electric field density is used, a conductive film which serves as an antenna is formed into a coil. Further, in the case where an electric field method (e.g., a UHF band (860 to 960 MHz band), a 2.45 GHz band, or the like) is employed as a transmission method, the length and shape of a conductive film which serves as an antenna may be determined as appropriate taking a wavelength of an electromagnetic wave used for signal transmission into consideration. For example, the conductive film which serves as an antenna is formed with a linear shape (e.g., a dipole antenna), a flat shape (e.g., a patch antenna), or the like. Further, the shape of a conductive film which serves as an antenna is not limited to a linear shape. Taking the wavelength of an electromagnetic wave into consideration, the shape may be a curved shape, a meandering shape, or a combination of these.

Note that an antenna combining antennas with a plurality of shapes, which can receive electromagnetic waves in different frequency bands, may be employed for the antenna circuit 211.

In the case of using a power feeder, there is no particular limitation on the frequency of electromagnetic waves transmitted from the power feeder to the antenna circuit 211, and for example, the electromagnetic waves may be any of the following waves: a 300 GHz to 3 THz submillimeter wave, a 30 GHz to 300 GHz millimeter wave, a 3 GHz to 30 GHz microwave, a 300 MHz to 3 GHz ultrahigh frequency wave, a 30 MHz to 300 MHz very high frequency wave, a 3 MHz to 30 MHz high frequency wave, a 300 kHz to 3 MHz medium frequency wave, a 30 kHz to 300 kHz low frequency wave, and a 3 kHz to 30 kHz very low frequency wave.

Although the rectifying circuit 212 in the RF battery 210 is a half-wave rectifying circuit, more efficient charging can be performed by using a full-wave rectifying circuit. By using the power storage circuit 213 with sufficiently high capacitance, the power storage circuit 213 can hold the potential of the second power supply line 111 "high" for a long time even if the antenna circuit 211 remains in a state where it cannot receive electromagnetic waves.

Figure 5:
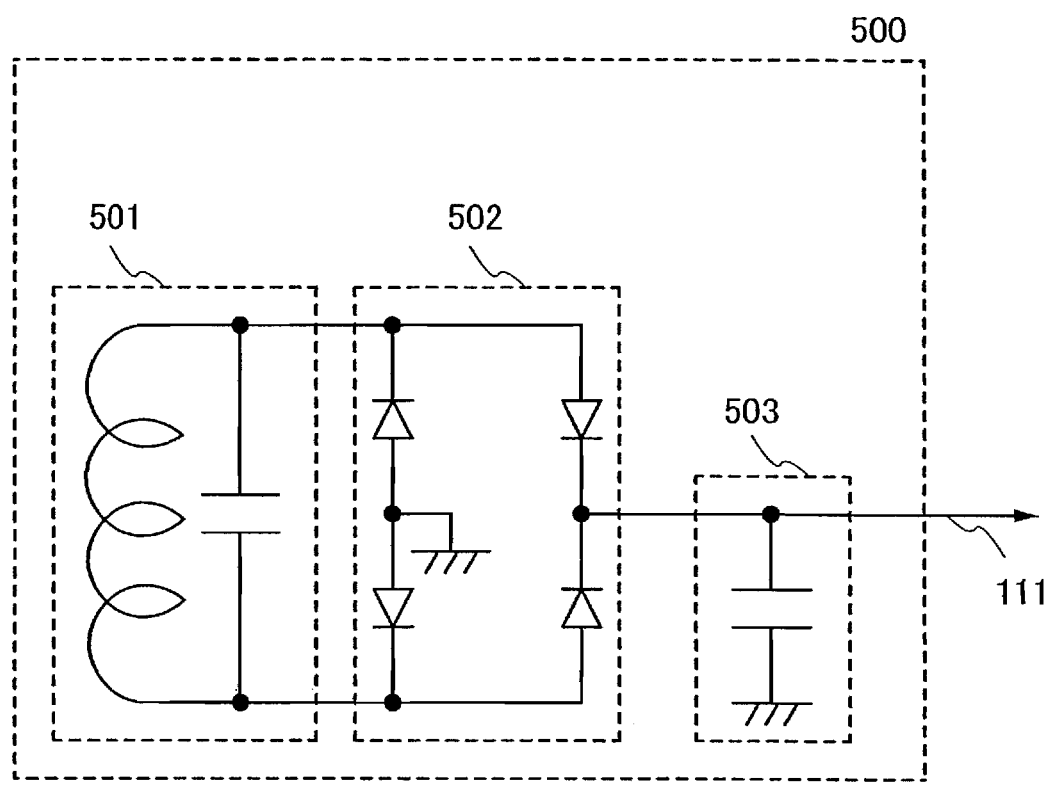
FIG. 5 is a diagram showing a structure example of a battery of a semiconductor device of the present invention.

In another specific example of a circuit structure of the RF battery, a full-wave rectifying circuit may be used. FIG. 5 is a specific circuit diagram thereof. An RF battery 500 includes an antenna circuit 501, a rectifying circuit 502, a power storage circuit 503, and the second power supply line 111. The function of each circuit is similar to that of the RF battery 210, so that the description is omitted. Note that the power storage circuit 213 and the power storage circuit 503 can have a similar structure to the power storage circuit 202.

As described above, the structure of the battery of FIG. 2A or 2B described in this embodiment mode can be applied to the battery 110 of the battery backed-up circuit portion 101 shown in FIG. 1. In particular, by using the RF battery of FIG. 2B, it becomes possible to charge the power storage circuit 213 from a distant location with the use of electromagnetic waves, so that it becomes possible to operate a circuit which is located in a place that makes contact difficult.

Note that the structure of each battery described in this embodiment mode can be applied to any semiconductor device described in the other embodiment modes of this specification.

Embodiment Mode 3

Figure 3A:
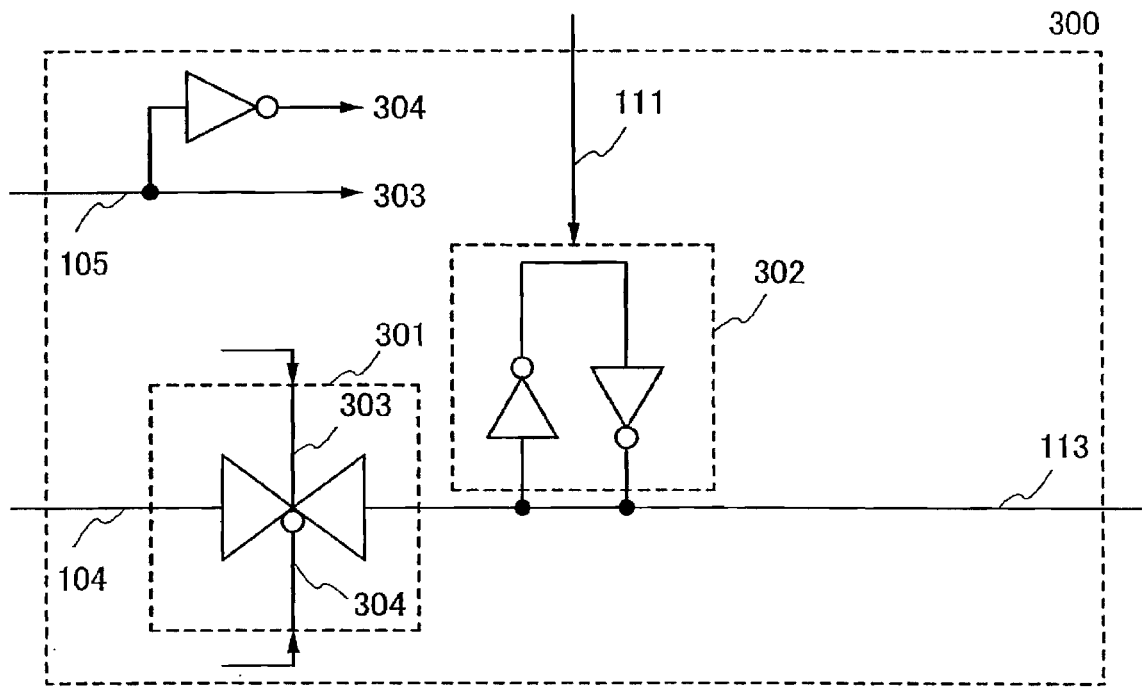
FIGS. 3A and 3B are diagrams each showing a structure example of a data holding circuit of a semiconductor device of the present invention.
Figure 3B:
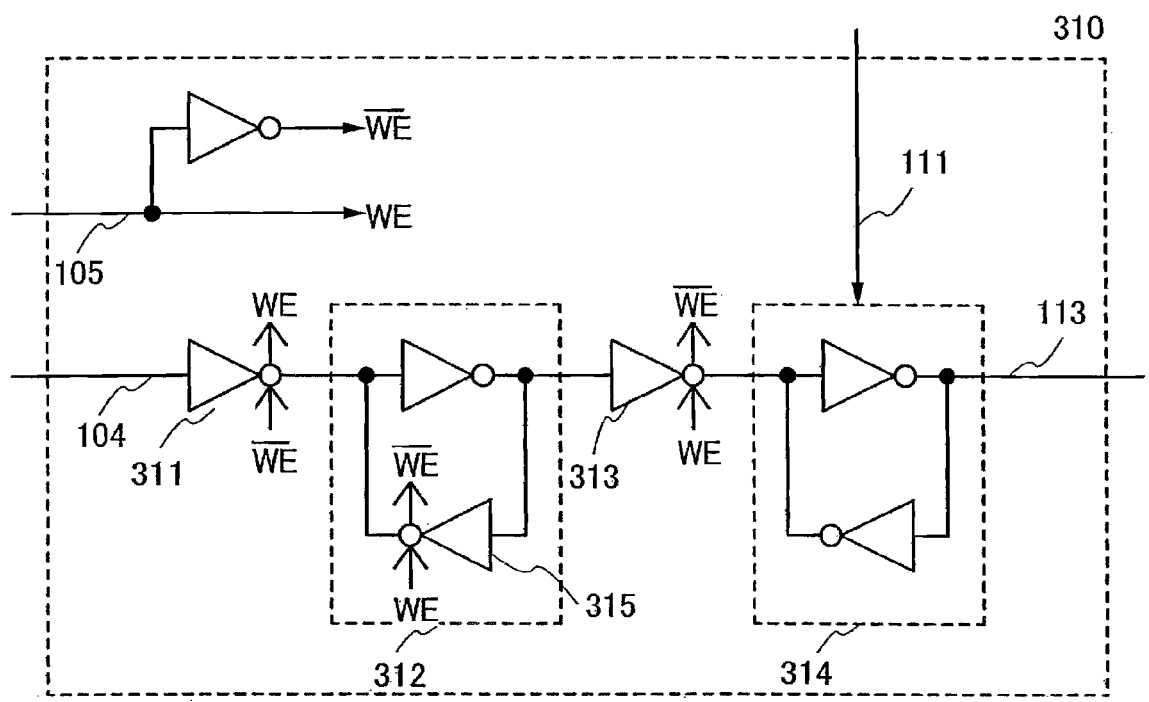

This embodiment mode describes a structure of the data holding circuit provided in the battery backed-up circuit portion of the semiconductor device described in Embodiment Mode 1, with reference to FIGS. 3A and 3B. Each of FIGS. 3A and 3B is an example of a specific circuit structure of the data holding circuit 112. The data holding circuit 112 is a circuit that continues to hold data by being supplied with electric power from the battery 110 even when the supply of electric power through the power supply line 103 is stopped. Each of FIGS. 3A and 3B shows a circuit structure capable of holding 1-bit information. In the structure of FIG. 1, data to be held is 2 bits, so that two data holding circuits may be used. In the case of n bits (n is a natural number), n data holding circuits may be used in combination.

A data holding circuit 300 shown in FIG. 3A includes an analog switch 301 and a latch 302. The analog switch 301 is connected to the first wiring 104, an analog switch switching signal line 303, an inverted analog switch switching signal line 304, and the third wiring 113. The potential of the analog switch switching signal line 303 is equal to the potential of the second wiring 105, and the potential of the inverted analog switch switching signal line 304 is an inversion thereof. The analog switch 301 is turned on when the potential of the analog switch switching signal line 303 is "high" and is turned off when it is "low". In other words, the analog switch 301 is turned on when the potential of the second wiring 105 is "high" and is turned off when it is "low". Electric power for the analog switch 301 is supplied through the power supply line 103, whereas electric power for the latch 302 is supplied through the second power supply line 111.

When the potential of the analog switch switching signal line 303 is "high", if the potential of the first wiring 104 is "high", "high" is written to the latch 302. Similarly, if the potential of the first wiring 104 is "low", "low" is written to the latch 302. Because the electric power for the latch 302 is supplied through the second power supply line 111, data is held, even if the supply of electric power through the power supply line 103 is stopped, as long as the potential of the second power supply line 111 continues to be "high". By using this data holding function, information about whether or not to use the spare memory cell is held. For example, after it is defined that the latch 302 holds "high" when the spare memory cell is to be used and holds "low" when not to be used, the decoder 120 may be designed to conform with this logic.

A structure of a data holding circuit 310 shown in FIG. 3B is described. The data holding circuit 310 shown in FIG. 3B includes a first clocked inverter 311, a first latch 312, a second clocked inverter 313, and a second latch 314. The first latch 312 is provided with a third clocked inverter 315. Electric power for the first clocked inverter 311, the second clocked inverter 313, and the first latch 312 is supplied through the first power supply line 103, whereas electric power for the second latch 314 is supplied through the second power supply line 111. Each of the first clocked inverter 311, the second clocked inverter 313, and the third clocked inverter 315 is connected to the second wiring 105 and an inverted holding circuit write enable signal line. The potential of the inverted holding circuit write enable signal line is generated by inversion of the potential of the second wiring 105 by an inverter. The second clocked inverter 313 and the third clocked inverter 315 are turned on when the potential of the second wiring 105 is "high" and are turned off when it is "low". The first clocked inverter 311 is turned on when the potential of the second wiring 105 is "low" and is turned off when it is "high".

The operation of the first latch 312 is described. If the potential of the first wiring 104 is "high" at the moment the potential of the second wiring 105 changes from "low" to "high", "low" is written to the first latch 312. Similarly, if the potential of the first wiring 104 is "low", "high" is written to the first latch 312. When the potential of the second wiring 105 is "high", the first latch 312 functions as a latch, whereas when the potential of the second wiring 105 is "low", the third clocked inverter 315 is turned off and the first latch 312 serves as an inverter circuit.

The operation of the second latch 314 is described. If "low" is written to the first latch 312 at the moment the potential of the second wiring 105 changes from "high" to "low", "high" is written to the second latch 314. Similarly, if "high" is written to the first latch 312, "low" is written to the second latch 314. The data written is held until the supply of electric power through the second power supply line 111 is stopped.

Because the electric power for the second latch 314 is supplied through the second power supply line 111, the data is held, even if the supply of electric power through the power supply line 103 is stopped, as long as the potential of the second power supply line 111 remains "high". By using this data holding function, information about whether or not to use the spare memory cell is held. For example, after it is defined that the second latch 314 holds "high" when the spare memory cell is to be used and holds "low" when not to be used, the decoder 120 may be designed to conform with this logic.

By using a plurality of data holding circuits 300 or data holding circuits 310, the data holding circuit 112 can be formed. In the structure of FIG. 1 described in Embodiment Mode 1, a data holding circuit is used for 2 bits in total, 1 bit for whether or not to use the spare memory cell and 1 bit for whether the spare memory cell is used when the address signal is "high" or when the address signal is "low".

As described above, the structure of FIG. 3A or 3B described in this embodiment mode can be applied to the data holding circuit 112 of the battery backed-up circuit portion 101 shown in FIG. 1. In addition, by employing the structure shown in FIG. 3A or 3B for the data holding circuit 112, it becomes possible to operate a circuit which is located in a place that makes contact difficult.

Note that the structure of each data holding circuit described in this embodiment mode can be applied to any semiconductor device described in the other embodiment modes of this specification.

Embodiment Mode 4

This embodiment mode describes an example of a manufacturing method of the semiconductor device described in the aforementioned embodiment modes, with reference to drawings. This embodiment mode describes a case where elements included in circuits of the semiconductor device such as the data holding circuit and the memory circuit are formed using thin film transistors over one substrate. In addition, it describes an example where a thin-film secondary battery is used as the power storage circuit provided in the battery. Needless to say, an electric double-layer capacitor or the like may be provided instead of the secondary battery. Note that this embodiment mode describes a case where elements such as thin film transistors once formed over a supporting substrate are transferred to a flexible substrate.

First, a peeling layer 1303 is formed over one surface of a substrate 1301 with an insulating film 1302 interposed therebetween, and then an insulating film 1304 functioning as a base film and a semiconductor film (e.g., a film containing amorphous silicon) 1305 are stacked thereover (see FIG. 6A). It is to be noted that the insulating film 1302, the peeling layer 1303, the insulating film 1304, and the semiconductor film 1305 can be formed consecutively.

The substrate 1301 is selected from a glass substrate, a quartz substrate, a metal substrate such as a stainless steel substrate, a ceramic substrate, a semiconductor substrate such as a Si substrate, a silicon-on-insulator (SOI) substrate, and the like. Alternatively, a plastic substrate made of polyethylene terephthalate (PET), polyethylene naphthalate (PEN), polyether sulfone (PES), acrylic, or the like can be used. In this process, although the peeling layer 1303 is provided over the entire surface of the substrate 1301 with the insulating film 1302 interposed therebetween, the peeling layer 1303 can also be selectively formed by photolithography after being provided over the entire surface of the substrate 1301.

The insulating films 1302 and 1304 are formed using insulating materials such as silicon oxide ($SiO_x$), silicon nitride ($SiN_x$), silicon oxynitride ($SiO_xN_y$, where x>y>0), or silicon nitride oxide ($SiN_xO_y$, where x>y>0) by a CVD method, a sputtering method, or the like. For example, when the insulating film 1302 or 1304 is formed to have a two-layer structure, a silicon nitride oxide film may be formed as a first insulating film and a silicon oxynitride film may be formed as a second insulating film. In addition, a silicon nitride film may be formed as a first insulating film and a silicon oxide film may be formed as a second insulating film. The insulating film 1302 functions as a blocking layer which prevents an impurity element contained in the substrate 1301 from getting mixed into the peeling layer 1303 or elements formed thereover. The insulating film 1304 functions as a blocking layer which prevents an impurity element contained in the substrate 1301 or the peeling layer 1303 from getting mixed into elements formed over the insulating film 1304. In this manner, providing the insulating films 1302 and 1304 which function as the blocking layers can prevent adverse effects on the elements formed over the peeling layer 1303 or the insulating film 1304, which would otherwise be caused by an alkali metal such as Na or an alkaline earth metal contained in the substrate 1301 or by the impurity element contained in the peeling layer 1303. It is to be noted that when quartz is used for the substrate 1301, for example, the insulating film 1302 may be omitted.

The peeling layer 1303 may be formed using a metal film, a stacked structure of a metal film and a metal oxide film, or the like. As a metal film, either a single layer or stacked layers is/are formed using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir), or an alloy material or a compound material containing such an element as its main component. In addition, such materials can be formed by a sputtering method, various CVD methods such as a plasma CVD method, or the like. A stacked structure of a metal film and a metal oxide film can be obtained by the steps of forming the above-described metal film, applying plasma treatment thereto under an oxygen atmosphere or an $N_2O$ atmosphere or applying heat treatment thereto under an oxygen atmosphere or an $N_2O$ atmosphere, and thereby forming oxide or oxynitride of the metal film on the surface of the metal film. For example, when a tungsten film is provided as a metal film by a sputtering method, a CVD method, or the like, a metal oxide film of tungsten oxide can be formed on the surface of the tungsten film by application of plasma treatment to the tungsten film. In addition, after a metal film (e.g., tungsten) is formed, an insulating film formed of silicon oxide or the like may be formed over the metal film by a sputtering method, and also metal oxide (e.g., tungsten oxide on tungsten) may be formed on the metal film.

The amorphous semiconductor film 1305 is formed with a thickness of 25 to 200 nm (preferably, 30 to 150 nm) by a sputtering method, an LPCVD method, a plasma CVD method, or the like.

Next, the amorphous semiconductor film 1305 is crystallized by laser irradiation. Alternatively, the crystallization of the amorphous semiconductor film 1305 may be performed by a method combining the laser crystallization with a thermal crystallization method using RTA or an annealing furnace or with a thermal crystallization method using a metal element that promotes the crystallization. After that, the crystallized semiconductor film is etched into a desired shape, whereby crystalline semiconductor films 1305a to 1305f are formed. Then, a gate insulating film 1306 is formed so as to cover the semiconductor films 1305a to 1305f (see FIG. 6B).

The gate insulating film 1306 is formed using an insulating material such as silicon oxide, silicon nitride, silicon oxynitride, or silicon nitride oxide by a CVD method, a sputtering method, or the like. For example, when the gate insulating film 1306 is formed to have a two-layer structure, it is preferable to form a silicon oxynitride film as a first insulating film and form a silicon nitride oxide film as a second insulating film. Alternatively, it is also preferable to form a silicon oxide film as a first insulating film and form a silicon nitride film as a second insulating film.

An example of a formation process of the crystalline semiconductor films 1305a to 1305f is briefly explained below. First, an amorphous semiconductor film with a thickness of 50 to 60 nm is formed by a plasma CVD method. Then, a solution containing nickel which is a metal element that promotes crystallization is retained on the amorphous semiconductor film, which is followed by dehydrogenation treatment (500° C. for one hour) and thermal crystallization treatment (550° C. for four hours). Thus, a crystalline semiconductor film is formed. Then, the crystalline semiconductor film is subjected to laser irradiation and then a photolithography process to form the crystalline semiconductor films 1305a to 1305f. It is to be noted that crystallization of the amorphous semiconductor film may be performed only by laser irradiation, not by thermal crystallization which uses a metal element that promotes crystallization.

As a laser oscillator used for crystallization, either a continuous wave laser oscillator (a CW laser oscillator) or a pulsed laser oscillator can be used. As a laser that can be used here, there are a gas laser such as an Ar laser, a Kr laser, or an excimer laser; a laser whose medium is single-crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; a glass laser; a ruby laser; an alexandrite laser; a Ti:sapphire laser; a copper vapor laser; and a gold vapor laser. When irradiation is performed with the fundamental wave of such a laser beam or the second to fourth harmonics of such a laser beam, crystals with a large grain size can be obtained. For example, the second harmonic (532 nm) or the third harmonic (355 nm) of an Nd:YVO$_4$ laser (the fundamental wave of 1064 nm) can be used. In this case, a laser power density of approximately 0.01 to 100 MW/cm$^2$ (preferably, 0.1 to 10 MW/cm$^2$) is needed, and irradiation is performed with a scanning rate of approximately 10 to 2000 cm/sec. It is to be noted that the laser whose medium is single crystalline YAG, YVO$_4$, forsterite (Mg$_2$SiO$_4$), YAlO$_3$, or GdVO$_4$ or polycrystalline (ceramic) YAG, Y$_2$O$_3$, YVO$_4$, YAlO$_3$, or GdVO$_4$ doped with one or more of Nd, Yb, Cr, Ti, Ho, Er, Tm, and Ta as a dopant; an Ar ion laser, or a Ti:sapphire laser can be used as a CW laser, whereas it can also be used as a pulsed laser with a repetition rate of 10 MHz or more by a Q-switch operation, mode locking, or the like. When a laser beam with a repetition rate of 10 MHz or more is used, a semiconductor film is irradiated with the next pulse during the period in which the semiconductor film has been melted by the laser beam and is solidified. Therefore, unlike the case of using a pulsed laser with a low repetition rate, a solid-liquid interface in the semiconductor film can be continuously moved. Thus, crystal grains which have grown continuously in the scanning direction can be obtained.

The gate insulating film 1306 may be formed by oxidization or nitridation of the surfaces of the semiconductor films 1305a to 1305f by the above-described high-density plasma treatment. For example, plasma treatment with a mixed gas of a rare gas such as He, Ar, Kr, or Xe, and oxygen, nitrogen oxide (NO$_2$), ammonia, nitrogen, or hydrogen is conducted. When plasma is excited by the introduction of microwaves, plasma with a low electron temperature and high density can be generated. With oxygen radicals (which may include OH radicals) or nitrogen radicals (which may include NH radicals) which are generated by the high-density plasma, a surface of a semiconductor film can be oxidized or nitrided.

By such high-density plasma treatment, an insulating film with a thickness of 1 to 20 nm, typically 5 to 10 nm, is formed on a semiconductor film. Since the reaction in this case is a solid-phase reaction, the interface state density between the insulating film and the semiconductor film can be quite low. Since such high-density plasma treatment directly oxidizes (or nitrides) a semiconductor film (crystalline silicon or polycrystalline silicon), desirably, an insulating film can be formed with extremely little unevenness. In addition, since crystal grain boundaries of crystalline silicon are not strongly oxidized, an excellent state is obtained. That is, by the solid-phase oxidation of a surface of a semiconductor film by high-density plasma treatment which is described in this embodiment mode, an insulating film with a uniform thickness and low interface state density can be formed without excessive oxidation reaction at the crystal grain boundaries.

As the gate insulating film, only an insulating film formed by high-density plasma treatment may be used, or a stacked layer may be employed, which is obtained by deposition of an insulating film such as silicon oxide, silicon oxynitride, or silicon nitride on the insulating film, by a CVD method using plasma or thermal reaction. In either case, a transistor which includes such an insulating film formed by high-density plasma treatment in a part or the whole of its gate insulating film can have reduced characteristic variations.

In addition, the semiconductor films 1305a to 1305f, which are obtained by irradiation of a semiconductor film with a continuous wave laser beam or a laser beam oscillated with a repetition rate of 10 MHz or more and scanning the semiconductor film with the laser beam in one direction to crystallize the semiconductor film, have a characteristic in that their crystals grow in the beam scanning direction. Transistors are each arranged so that its channel length direction (direction in which carriers move when a channel formation region is formed) is aligned with the scanning direction, and the above-described gate insulating film is combined with the semiconductor film, whereby thin film transistors (TFTs) with high electron field effect mobility and reduced variations in characteristics can be obtained.

Next, a first conductive film and a second conductive film are stacked over the gate insulating film 1306. Here, the first conductive film is formed to a thickness of 20 to 100 nm by a CVD method, a sputtering method, or the like. The second conductive film is formed to a thickness of 100 to 400 nm. The first conductive film and the second conductive film are formed of an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component. Alternatively, a semiconductor material typified by polycrystalline silicon doped with an impurity element such as phosphorus can also be used. As combination examples of the first conductive film and the second conductive film, a tantalum nitride film and a tungsten film; a tungsten nitride film and a tungsten film; a molybdenum nitride film and a molybdenum film; and the like can be given. Tungsten and tantalum nitride have high heat resistance. Therefore, after forming the first conductive film and the second conductive film, heat treatment for the purpose of thermal activation can be applied thereto. In addition, in the case where a two-layer structure is not employed, but a three-layer structure is employed, it is preferable to use a stacked structure of a molybdenum film, an aluminum film, and a molybdenum film.

Next, a resist mask is formed by photolithography, and etching treatment is conducted to form gate electrodes and gate lines. Thus, gate electrodes 1307 are formed above the semiconductor films 1305a to 1305f. Here, a stacked structure of a first conductive film 1307a and a second conductive film 1307b is shown as an example of the gate electrode 1307.

Next, the semiconductor films 1305a to 1305f are doped with an n-type impurity element at low concentration, using the gate electrodes 1307 as masks by an ion doping method or an ion implantation method. Then, a resist mask is selectively formed by photolithography, and the semiconductor films 1305c and 1305e are doped with a p-type impurity element at high concentration. As an n-type impurity element, phosphorus (P), arsenic (As), or the like can be used. As a p-type impurity element, boron (B), aluminum (Al), gallium (Ga), or the like can be used. Here, phosphorus (P) is used as an n-type impurity element and is selectively introduced into the semiconductor films 1305a to 1305f so as to be contained at concentrations of $1 \times 10^{15}$ to $1 \times 10^{19}/\text{cm}^3$. Thus, n-type impurity regions 1308 are formed. In addition, boron (B) is used as a p-type impurity element, and is selectively introduced into the semiconductor films 1305c and 1305e so as to be contained at concentrations of $1 \times 10^{19}$ to $1 \times 10^{20}/\text{cm}^3$. Thus, p-type impurity regions 1309 are formed (see FIG. 6C).

Subsequently, an insulating film is formed so as to cover the gate insulating film 1306 and the gate electrodes 1307. The insulating film is formed using either a single layer or a stacked layer of a film containing an inorganic material such as silicon, silicon oxide, or silicon nitride, or a film containing an organic material such as an organic resin by a plasma CVD method, a sputtering method, or the like. Next, the insulating film is selectively etched by anisotropic etching mainly in the perpendicular direction, so that insulating films 1310 (also referred to as sidewalls) which are in contact with the side surfaces of the gate electrodes 1307 are formed. The insulating films 1310 are used as masks in doping for forming LDD (Lightly Doped Drain) regions.

Next, the semiconductor films 1305a, 1305b, 1305d, and 1305f are doped with an n-type impurity element at high concentration, using resist masks formed by photolithography, the gate electrodes 1307, and the insulating films 1310 as masks. Thus, n-type impurity regions 1311 are formed. Here, phosphorus (P) is used as an n-type impurity element, and is selectively introduced into the semiconductor films 1305a, 1305b, 1305d, and 1305f so as to be contained at concentrations of $1 \times 10^{19}$ to $1 \times 10^{20}/\text{cm}^3$. Thus, the n-type impurity regions 1311 with higher concentration of impurity than that of the impurity regions 1308 are formed.

Through the above steps, n-channel thin film transistors 1300a, 1300b, 1300d, and 1300f, and p-channel thin film transistors 1300c and 1300e are formed (see FIG. 6D).

In the n-channel thin film transistor 1300a, a channel formation region is formed in a region of the semiconductor film 1305a which overlaps with the gate electrode 1307; the impurity regions 1311 serving as source and drain regions are formed in regions of the semiconductor film 1305a which do not overlap with the gate electrode 1307 and the insulating film 1310; and low concentration impurity regions (LDD regions) are formed in regions of the semiconductor film 1305a which overlap with the insulating film 1310, between the channel formation region and the impurity regions 1311. Similarly, channel formation regions, low concentration impurity regions, and the impurity regions 1311 are formed in the n-channel thin film transistors 1300b, 1300d, and 1300f.

In the p-channel thin film transistor 1300c, a channel formation region is formed in a region of the semiconductor film 1305c which overlaps with the gate electrode 1307, and the impurity regions 1309 serving as source and drain regions are formed in regions of the semiconductor film 1305c which do not overlap with the gate electrode 1307. Similarly, a channel formation region and the impurity regions 1309 are formed in the p-channel thin film transistor 1300e. Here, although LDD regions are not formed in the p-channel thin film transistors 1300c and 1300e, LDD regions may be provided in the p-channel thin film transistors or a structure without LDD regions may be applied to the n-channel thin film transistors.

Figure 7A:
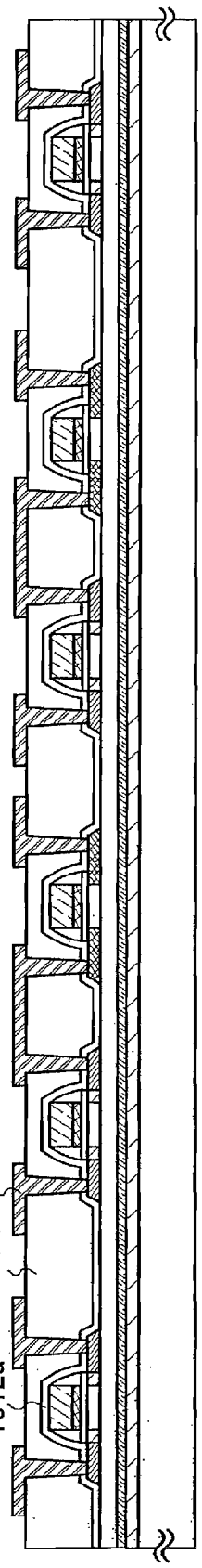
FIGS. 7A to 7C show an example of a manufacturing method of a semiconductor device of the present invention.

Next, an insulating film with a single layer structure or a stacked layer structure is formed so as to cover the semiconductor films 1305a to 1305f, the gate electrodes 1307, and the like. Then, conductive films 1313 electrically connected to the impurity regions 1309 and 1311 which serve as the source and drain regions of the thin film transistors 1300a to 1300f are formed over the insulating film (see FIG. 7A). The insulating film is formed with a single layer or a stacked layer, using an inorganic material such as silicon oxide or silicon nitride, an organic material such as polyimide, polyamide, benzocyclobutene, acrylic, or epoxy, a siloxane material, or the like by a CVD method, a sputtering method, an SOG method, a droplet discharging method, a screen printing method, or the like. In this embodiment mode, the insulating film is formed to have a two-layer structure, and a silicon nitride oxide film is formed as a first insulating film 1312a and a silicon oxynitride film is formed as a second insulating film 1312b. In addition, the conductive films 1313 can form the source and drain electrodes of the thin film transistors 1300a to 1300f.

Before the insulating films 1312a and 1312b are formed or after one or both of the insulating films 1312a and 1312b is/are formed, heat treatment is preferably conducted for recovery of the crystallinity of the semiconductor films, activation of the impurity element which has been added into the semiconductor films, or hydrogenation of the semiconductor films. As the heat treatment, thermal annealing, laser annealing, RTA, or the like may be applied.

The conductive films 1313 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing the element as its main component by a CVD method, a sputtering method, or the like. An alloy material containing aluminum as its main component corresponds to, for example, a material which contains aluminum as its main component and also contains nickel, or a material which contains aluminum as its main component and also contains nickel and one or both of carbon and silicon. The conductive films 1313 are preferably formed to have a stacked structure of a barrier film, an aluminum silicon film, and a barrier film or a stacked structure of a barrier film, an aluminum silicon film, a titanium nitride film, and a barrier film. Note that the "barrier film" corresponds to a thin film formed of titanium, titanium nitride, molybdenum, or molybdenum nitride. Aluminum and aluminum silicon are suitable materials for forming the conductive films 1313 because they have low resistance value and are inexpensive. When barrier layers are provided as the top layer and the bottom layer, generation of hillocks of aluminum or aluminum silicon can be prevented. In addition, when a barrier film is formed of titanium which is an element having a high reducing property, even if a thin natural oxide film is formed on the crystalline semiconductor film, the natural oxide film can be reduced, and a favorable contact between the conductive film 1313 and the crystalline semiconductor film can be obtained.

Next, an insulating film 1314 is formed so as to cover the conductive films 1313, and conductive films 1315a and 1315b electrically connected to the conductive films 1313 which form the source electrodes or the drain electrodes of the thin film transistors 1300a and 1300f are formed over the insulating film 1314. In addition, a conductive film 1316 electrically connected to the conductive film 1313 which forms the source electrode or drain electrode of the thin film transistor 1300b is formed. It is to be noted that the conductive films 1315a and 1315b and the conductive film 1316 may be formed using the same material at the same time. The conductive films 1315a and 1315b and the conductive film 1316 can be formed using any of the above-described materials for the conductive film 1313.

Figure 7B:
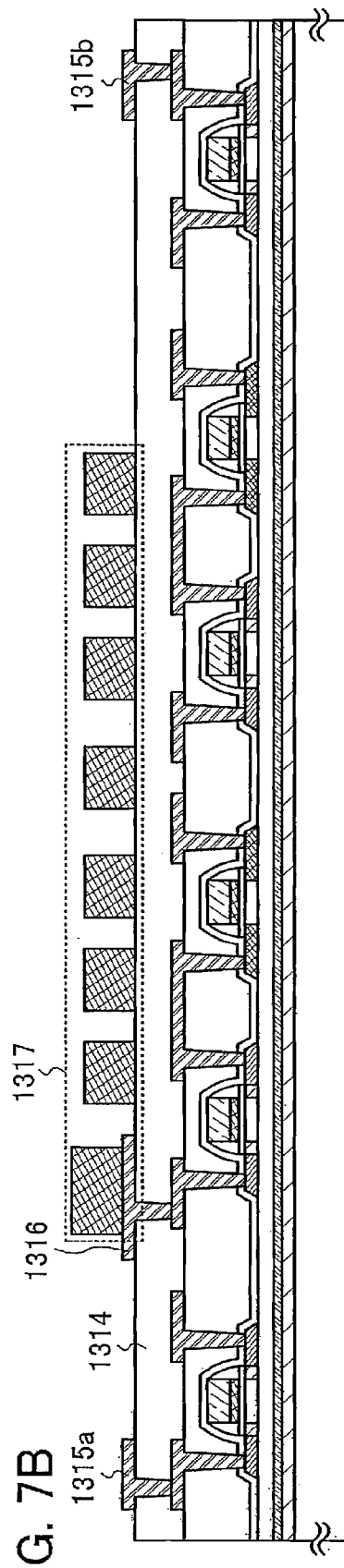

Next, a conductive film 1317 functioning as an antenna is formed so as to be electrically connected to the conductive film 1316 (see FIG. 7B).

The insulating film 1314 can be formed with a single layer or a stacked layer of an insulating film containing oxygen and/or nitrogen such as silicon oxide, silicon nitride, silicon oxynitride, or silicon nitride oxide; a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method, or the like. It is to be noted that a siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. In addition, a fluoro group may be used as the substituent. Further, both a fluoro group and an organic group containing at least hydrogen may be used as the substituent.

The conductive film 1317 is formed of a conductive material by a CVD method, a sputtering method, a printing method such as screen printing or gravure printing, a droplet discharging method, a dispenser method, a plating method, or the like. The conductive film 1317 is formed with a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as its main component.

For example, when the conductive film 1317 functioning as an antenna is formed by a screen printing method, the conductive film 1317 can be provided by selective printing of a conductive paste in which conductive particles with a grain diameter of several nanometers to several tens of micrometers are dissolved or dispersed in an organic resin. The conductive particles can be at least one or more of metal particles selected from silver (Ag), gold (Au), copper (Cu), nickel (Ni), platinum (Pt), palladium (Pd), tantalum (Ta), molybdenum (Mo), titanium (Ti), and the like; fine particles of silver halide; and dispersive nanoparticles thereof. In addition, the organic resin included in the conductive paste can be one or more of organic resins which function as a binder, a solvent, a dispersing agent, and a coating material of the metal particles. Typically, organic resins such as an epoxy resin and a silicone resin can be given as examples. Preferably, a conductive paste is extruded and then baked to form the conductive film. For example, in the case of using fine particles (e.g., a grain diameter of 1 to 100 nm) containing silver as its main component as a material of the conductive paste, the conductive paste is baked and hardened at temperatures of 150 to 300° C., so that the conductive film can be obtained. Alternatively, it is also possible to use fine particles containing solder or lead-free solder as its main component. In that case, fine particles with a grain diameter of 20 μm or less are preferably used. Solder and lead-free solder have the advantage of low cost.

The conductive films 1315a and 1315b can function as wirings which are electrically connected to a secondary battery included in the semiconductor device of the present invention in a later step. In addition, in forming the conductive film 1317 which functions as an antenna, other conductive films may be separately formed so as to be electrically connected to the conductive films 1315a and 1315b, so that the conductive films can be utilized as the wirings for connecting the conductive films 1315a and 1315b to the secondary battery.

Figure 7C:
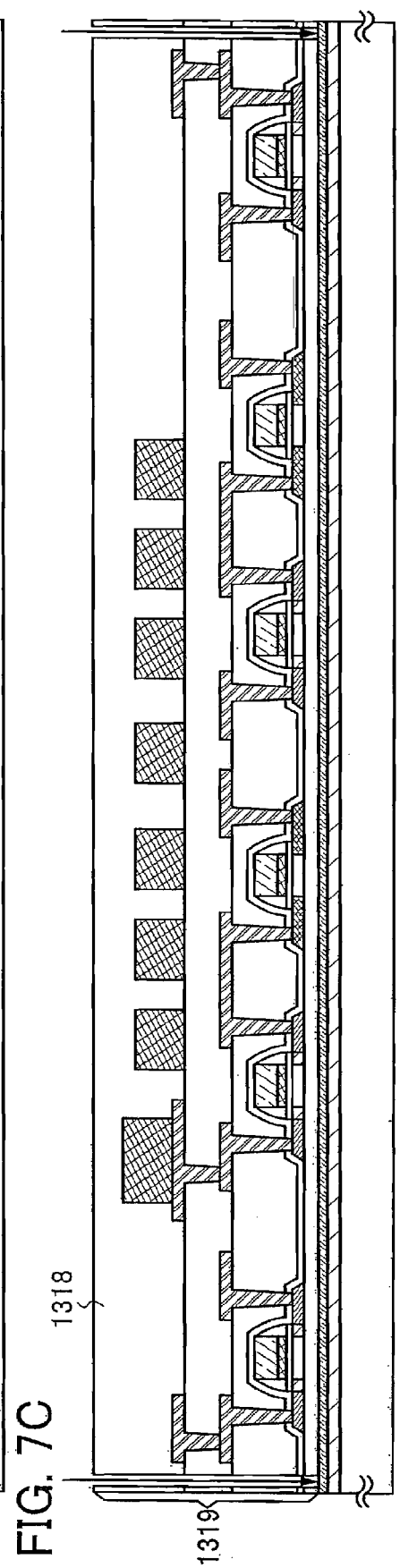

Next, after forming an insulating film 1318 so as to cover the conductive film 1317, a layer including the thin film transistors 1300a to 1300f, the conductive film 1317, and the like (hereinafter referred to as an "element formation layer 1319") is peeled off the substrate 1301. Here, after forming opening portions in the element formation layer 1319 excluding the region of the thin film transistors 1300a to 1300f by laser irradiation (e.g., UV light irradiation) (see FIG. 7C), the element formation layer 1319 can be peeled off the substrate 1301 with a physical force. Note that by peeling the element formation layer 1319 while wetting with a liquid such as water, the thin film transistors provided in the element formation layer 1319 can be prevented from being damaged by static electricity. In addition, by reuse of the substrate 1301 from which the element formation layer 1319 has been peeled, cost reduction can be achieved.

The insulating film 1318 can be formed with a single layer or a stacked layer of an insulating film containing oxygen and/or nitrogen such as silicon oxide, silicon nitride, silicon oxynitride, or silicon nitride oxide; a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method, or the like.

In this embodiment mode, after forming the opening portions in the element formation layer 1319 by laser irradiation, a first sheet material 1320 is attached to one surface of the element formation layer 1319 (the surface where the insulating film 1318 is exposed), and then the element formation layer 1319 is peeled off the substrate 1301 (see FIG. 8A).

Next, a second sheet material 1321 is attached to the other surface of the element formation layer 1319 (the surface exposed by peeling), followed by one or both of heat treatment and pressurization treatment for attachment of the second sheet material 1321 (see FIG. 8B). A hot-melt film or the like can be used as the first sheet material 1320 and the second sheet material 1321.

As the first sheet material 1320 and the second sheet material 1321, a film on which antistatic treatment for preventing static electricity or the like has been applied (hereinafter referred to as an antistatic film) can also be used. As examples of the antistatic film, a film in which an antistatic material is dispersed in a resin, a film to which an antistatic material is attached, and the like can be given. The film provided with an antistatic material can be a film with an antistatic material provided on one of its surfaces, or a film with an antistatic material provided on each of its surfaces. The film with an antistatic material provided on one of its surfaces may be attached to the layer so that the antistatic material is placed on the inner side of the film or the outer side of the film. The antistatic material may be provided over the entire surface of the film, or over a part of the film. As an antistatic material, a metal, indium tin oxide (ITO), or a surfactant such as an amphoteric surfactant, a cationic surfactant, or a nonionic surfactant can be used. Further, as an antistatic material, a resin material which contains a cross-linked copolymer having a carboxyl group and a quaternary ammonium base on its side chain, or the like can be used. Such a material is attached, mixed, or applied to a film, so that an antistatic film can be formed. The element formation layer is sealed using the antistatic film, so that the semiconductor elements can be protected from adverse effects such as external static electricity when dealt with as a commercial product.

It is to be noted that a thin-film secondary battery is connected to the conductive films 1315*a* and 1315*b*, so that a battery provided in a battery backed-up circuit portion of a semiconductor device is formed. The connection with the secondary battery may be conducted before the element formation layer 1319 is peeled off the substrate 1301 (at the stage shown in FIG. 7B or FIG. 7C), after the element formation layer 1319 is peeled off the substrate 1301 (at the stage shown in FIG. 8A), or after the element formation layer 1319 is sealed with the first sheet material 1320 and the second sheet material 1321 (at the stage shown in FIG. 8B). An example where the element formation layer 1319 and the secondary battery are formed to be connected is explained below with reference to FIGS. 9A and 9B and FIGS. 10A and 10B.

At the stage shown in FIG. 7B, conductive films 1331*a* and 1331*b* which are electrically connected to the conductive films 1315*a* and 1315*b*, respectively are formed at the same time as the conductive film 1317 which functions as an antenna. Then, the insulating film 1318 is formed so as to cover the conductive films 1317, 1331*a*, and 1331*b*, followed by formation of opening portions so that the surfaces of the conductive films 1331*a* and 1331*b* are exposed. After that, the opening portions are formed in the element formation layer 1319 by laser irradiation, and then the first sheet material 1320 is attached to one surface of the element formation layer 1319 (the surface where the insulating film 1318 is exposed), so that the element formation layer 1319 is peeled off the substrate 1301 (see FIG. 9A).

Next, the second sheet material 1321 is attached to the other surface of the element formation layer 1319 (the surface exposed by peeling), and the element formation layer 1319 is peeled off the first sheet material 1320. Therefore, a material with low viscosity is used as the first sheet material 1320. Then, conductive films 1334*a* and 1334*b* which are electrically connected to the conductive films 1331*a* and 1331*b* respectively through the opening portions are selectively formed (see FIG. 9B).

The conductive films 1334*a* and 1334*b* are formed of a conductive material by a CVD method, a sputtering method, a printing method such as screen printing or gravure printing, a droplet discharging method, a dispenser method, a plating method, or the like. The conductive films 1334*a* and 1334*b* are formed with a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing the element as its main component.

Although the example shown in this embodiment mode is the case where the conductive films 1334*a* and 1334*b* are formed after peeling the element formation layer 1319 off the substrate 1301, the element formation layer 1319 may be peeled off the substrate 1301 after the formation of the conductive films 1334*a* and 1334*b*.

Figure 10A:
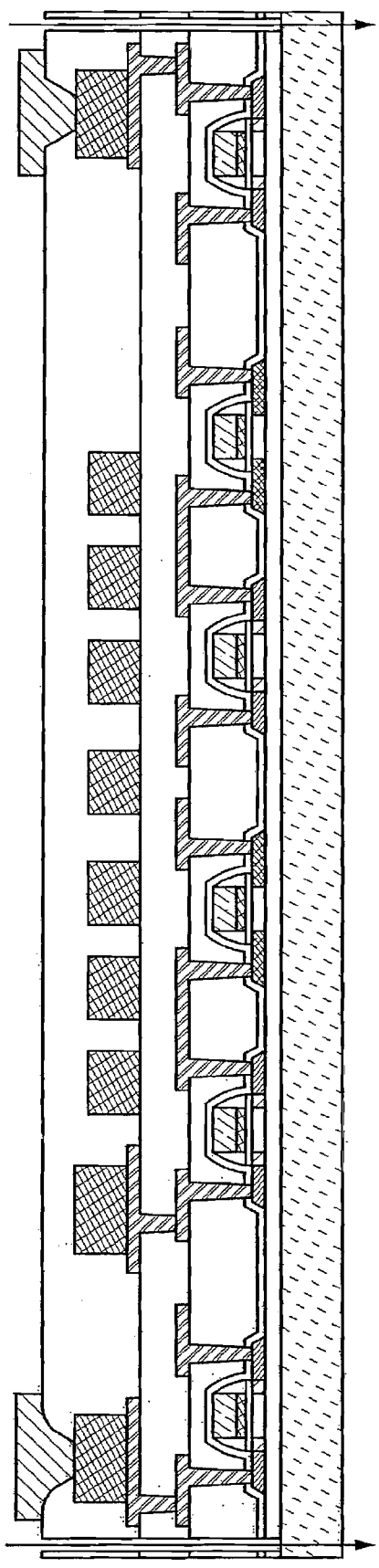
FIGS. 10A and 10B show an example of a manufacturing method of a semiconductor device of the present invention.

Next, in the case where a plurality of elements are formed over the substrate, the element formation layer 1319 is cut into elements (see FIG. 10A). A laser irradiation apparatus, a dicing apparatus, a scribing apparatus, or the like can be used for the cutting. At this time, the plurality of elements formed over one substrate are separated from one another by laser irradiation.

Figure 10B:
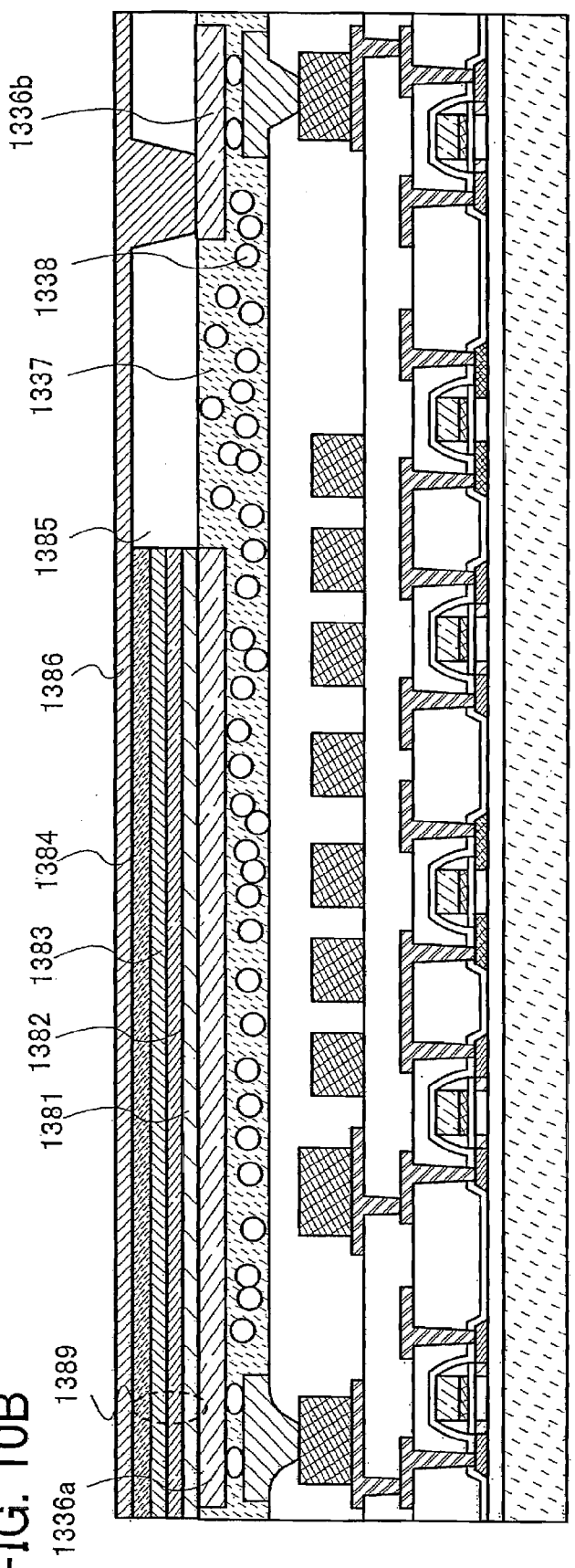

Next, the separated elements are electrically connected to the secondary battery (see FIG. 10B). In this embodiment mode, a thin-film secondary battery is used as the battery of the battery backed-up circuit portion of the semiconductor device, in which a current-collecting thin film, a negative electrode active material layer, a solid electrolyte layer, a positive electrode active material layer, and a current-collecting thin film are sequentially stacked.

Conductive films 1336*a* and 1336*b* are formed of a conductive material by a CVD method, a sputtering method, a printing method such as screen printing or gravure printing, a droplet discharging method, a dispenser method, a plating method, or the like. The conductive films 1336*a* and 1336*b* are formed with a single layer or a stacked layer of an element selected from aluminum (Al), titanium (Ti), silver (Ag), copper (Cu), gold (Au), platinum (Pt), nickel (Ni), palladium (Pd), tantalum (Ta), and molybdenum (Mo), or an alloy material or a compound material containing such an element as its main component. The conductive material should have high adhesion to a negative electrode active material layer and also low resistance. In particular, aluminum, copper, nickel, vanadium, or the like is preferably used.

The structure of a thin-film secondary battery 1389 is described next. A negative electrode active material layer 1381 is formed over the conductive film 1336*a*. In general, vanadium oxide ($V_2O_5$) or the like is used. Next, a solid electrolyte layer 1382 is formed over the negative electrode active material layer 1381. In general, lithium phosphate ($Li_3PO_4$) or the like is used. Next, a positive electrode active material layer 1383 is formed over the solid electrolyte layer 1382. In general, lithium manganate ($LiMn_2O_4$) or the like is used. Lithium cobaltate ($LiCoO_2$) or lithium nickel oxide ($LiNiO_2$) may also be used. Next, a current-collecting thin film 1384 to serve as an electrode is formed over the positive electrode active material layer 1383. The current-collecting thin film 1384 should have high adhesion to the positive electrode active material layer 1383 and also low resistance. For example, aluminum, copper, nickel, vanadium, or the like can be used.

Each of the above thin layers of the negative electrode active material layer 1381, the solid electrolyte layer 1382, the positive electrode active material layer 1383, and the current-collecting thin film 1384 may be formed by a sputtering technique or an evaporation technique. In addition, the thickness of each layer is preferably 0.1 to 3 µm.

Next, an interlayer film 1385 is formed by application of a resin. The interlayer film 1385 is etched to form a contact hole. The interlayer film 1385 is not limited to a resin, and other films such as an oxide film formed by CVD method or the like may be used as well; however, a resin is preferably used in terms of flatness. Alternatively, the contact hole may be formed without using etching, but using a photosensitive resin. Next, a wiring layer 1386 is formed over the interlayer film 1385 and connected to the conductive film 1336*b*. Thus, an electrical connection of the thin-film secondary battery is secured.

Here, the conductive films 1334*a* and 1334*b* which are provided in the element formation layer 1319 are connected to the conductive films 1336*a* and 1336*b* respectively in advance, which serve as the connection terminals of the thin-film secondary battery 1389. Here, an example is shown in which an electrical connection between the conductive films 1334*a* and 1336*a* or an electrical connection between the conductive films 1334*b* and 1336*b* is performed by pressure bonding with an adhesive material such as an anisotropic conductive film (ACF) or an anisotropic conductive paste (ACP) interposed therebetween. In this embodiment mode, the example is shown, in which the connection is performed using conductive particles 1338 included in an adhesive resin 1337. Alternatively, a conductive adhesive such as a silver paste, a copper paste, or a carbon paste; solder joint; or the like can be used.

The structures of such transistors can be various without being limited to the specific structures shown in this embodiment mode. For example, a multi-gate structure having two or more gate electrodes may be employed. When a multi-gate structure is employed, a structure in which channel regions are connected in series is provided; therefore, a structure in which a plurality of transistors are connected in series is provided. When a multi-gate structure is employed, various advantages can be obtained in that off-current can be reduced; withstand voltage of the transistor can be increased, so that the reliability is increased; and even if drain-source voltage changes when the transistor operates in the saturation region, a drain-source current does not change very much, and thus flat characteristics can be obtained. In addition, a structure in which gate electrodes are formed above and below a channel may also be employed. When a structure in which gate electrodes are formed above and below a channel is employed, the channel region is enlarged and the amount of current flowing therethrough can be increased. Thus, a depletion layer can be easily formed and the subthreshold swing (S value) can be decreased. When gate electrodes are formed above and below a channel, a structure in which a plurality of transistors are connected in parallel is provided.

In addition, the transistors may have any of the following structures: a structure in which a gate electrode is formed above a channel; a structure in which a gate electrode is formed below a channel; a staggered structure; an inverted staggered structure. In addition, the transistors may have a structure in which a channel region is divided into a plurality of regions and the divided regions are connected in parallel or in series. In addition, a channel (or part thereof) may overlap with a source electrode or a drain electrode. When a structure in which a channel (or part thereof) overlaps with a source electrode or a drain electrode is employed, electric charges can be prevented from being accumulated in part of the channel and thus an unstable operation can be prevented. In addition, an LDD (Lightly Doped Drain) region may be provided. When an LDD region is provided, off-current can be reduced; the withstand voltage of the transistor can be increased, so that the reliability is increased; and even if drain-source voltage changes when the transistor operates in the saturation region, drain-source current does not change very much, and thus flat characteristics can be obtained.

The method for manufacturing the semiconductor device in this embodiment mode can be applied to any of the semiconductor devices in the other embodiment modes.

Embodiment Mode 5

Embodiment Mode 5 describes an example of a method for manufacturing a semiconductor device, which is different from that in Embodiment Mode 4, with reference to drawings. This embodiment mode describes a case where elements or the like included in circuits of a semiconductor device such as a data holding circuit or a memory circuit portion are formed over one semiconductor substrate. In addition, it describes an example in which the secondary battery described in Embodiment Mode 4 is used as a power storage circuit provided in a battery. Needless to say, an electric double-layer capacitor or the like can be provided instead of the secondary battery.

First, insulating films (also referred to as field oxide films) 2302 are formed on a semiconductor substrate 2300 to form regions (also referred to as element formation regions or element separation regions) 2304 and 2306 (see FIG. 11A). The regions 2304 and 2306 provided in the semiconductor substrate 2300 are insulated from each other by the insulating film 2302. The example shown here is the case where a single crystal Si substrate having n-type conductivity is used as the semiconductor substrate 2300, and a p well 2307 is formed in the region 2306 of the semiconductor substrate 2300.

Any substrate can be used as the semiconductor substrate 2300 as long as it is a semiconductor substrate. For example, a single crystal Si substrate having n-type or p-type conductivity, a compound semiconductor substrate (e.g., a GaAs substrate, an InP substrate, a GaN substrate, a SiC substrate, a sapphire substrate, or a ZnSe substrate), an SOI (Silicon on Insulator) substrate formed by a bonding method or a SIMOX (Separation by IMplanted OXygen) method, or the like can be used.

The regions 2304 and 2306 can be formed by a LOCOS (LOCal Oxidation of Silicon) method, a trench isolation method, or the like.

In addition, the p well 2307 formed in the region 2306 of the semiconductor substrate 2300 can be formed by selective doping of the semiconductor substrate 2300 with a p-type impurity element. As a p-type impurity element, boron (B), aluminum (Al), gallium (Ga), or the like can be used.

In this embodiment mode, although the region 2304 is not doped with an impurity element because a semiconductor substrate having n-type conductivity is used as the semiconductor substrate 2300, an n well may be formed in the region 2304 by introduction of an n-type impurity element. As an n-type impurity element, phosphorus (P), arsenic (As), or the like can be used. When a semiconductor substrate having p-type conductivity is used, on the other hand, the region 2304 may be doped with an n-type impurity element to form an n well, whereas the region 2306 may be doped with no impurity element.

Next, insulating films 2332 and 2334 are formed so as to cover the regions 2304 and 2306, respectively (see FIG. 11B).

For example, surfaces of the regions 2304 and 2306 provided in the semiconductor substrate 2300 are oxidized by heat treatment, so that the insulating films 2332 and 2334 can be formed of silicon oxide films. Alternatively, the insulating films 2332 and 2334 may be formed to have a stacked structure of a silicon oxide film and a film containing oxygen and nitrogen (a silicon oxynitride film) by the steps of forming a silicon oxide film by a thermal oxidation method and then nitriding the surface of the silicon oxide film by nitridation treatment.

Further alternatively, the insulating films 2332 and 2334 can be formed by plasma treatment as described above. For example, the insulating films 2332 and 2334 can be formed using a silicon oxide film or a silicon nitride film which is obtained by application of high-density plasma oxidation or high-density plasma nitridation treatment to the surfaces of the regions 2304 and 2306 provided in the semiconductor substrate 2300. Furthermore, after applying high-density plasma oxidation treatment to the surfaces of the regions 2304 and 2306, high-density plasma nitridation treatment may be performed. In that case, silicon oxide films are formed on the surfaces of the regions 2304 and 2306, and then silicon oxynitride films are formed on the silicon oxide films. Thus, the insulating films 2332 and 2334 are each formed to have a stacked structure of the silicon oxide film and the silicon oxynitride film. In addition, after silicon oxide films are formed on the surfaces of the regions 2304 and 2306 by a thermal oxidation method, high-density plasma oxidation or high-density nitridation treatment may be applied to the silicon oxide films.

The insulating films 2332 and 2334 formed over the regions 2304 and 2306 of the semiconductor substrate 2300 respectively function as the gate insulating films of transistors which are completed later.

Next, a conductive film is formed so as to cover the insulating films 2332 and 2334 which are formed over the regions 2304 and 2306, respectively (see FIG. 11C). Here, an example is shown in which the conductive film is formed by sequentially stacking conductive films 2336 and 2338. Needless to say, the conductive film may be formed using a single layer or a stacked structure of three or more layers.

As materials of the conductive films 2336 and 2338, an element selected from tantalum (Ta), tungsten (W), titanium (Ti), molybdenum (Mo), aluminum (Al), copper (Cu), chromium (Cr), niobium (Nb), and the like, or an alloy material or a compound material containing such an element as its main component can be used. Alternatively, a metal nitride film obtained by nitridation of the above element can be used. Besides, a semiconductor material typified by polycrystalline silicon doped with an impurity element such as phosphorus can be used.

In this case, a stacked structure is employed in which the conductive film 2336 is formed using tantalum nitride and the conductive film 2338 is formed thereover using tungsten. Alternatively, it is also possible to form the conductive film 2336 using a single-layer film or a stacked film of tungsten nitride, molybdenum nitride, and/or titanium nitride and form the conductive film 2338 using a single-layer film or a stacked film of tantalum, molybdenum, and/or titanium.

Next, the stacked conductive films 2336 and 2338 are selectively removed by etching, so that the conductive films 2336 and 2338 remain above part of the regions 2304 and 2306, respectively. Thus, gate electrodes 2340 and 2342 are formed (see FIG. 12A).

Next, a resist mask 2348 is selectively formed so as to cover the region 2304, and the region 2306 is doped with an impurity element, using the resist mask 2348 and the gate electrode 2342 as masks, so that impurity regions are formed (see FIG. 12B). As an impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. Here, phosphorus (P) is used as the impurity element.

In FIG. 12B, by introduction of an impurity element, impurity regions 2352 which form source and drain regions and a channel formation region 2350 are formed in the region 2306.

Next, a resist mask 2366 is selectively formed so as to cover the region 2306, and the region 2304 is doped with an impurity element, using the resist mask 2366 and the gate electrode 2340 as masks, so that impurity regions are formed (see FIG. 12C). As the impurity element, an n-type impurity element or a p-type impurity element is used. As an n-type impurity element, phosphorus (P), arsenic (As), or the like can be used. As a p-type impurity element, boron (B), aluminum (Al), gallium (Ga), or the like can be used. At this time, an impurity element (e.g., boron (B)) of a conductivity type different from that of the impurity element introduced into the region 2306 in FIG. 12B is used. As a result, impurity regions 2370 which form source and drain regions and a channel formation region 2368 are formed in the region 2304.

Figure 13A:
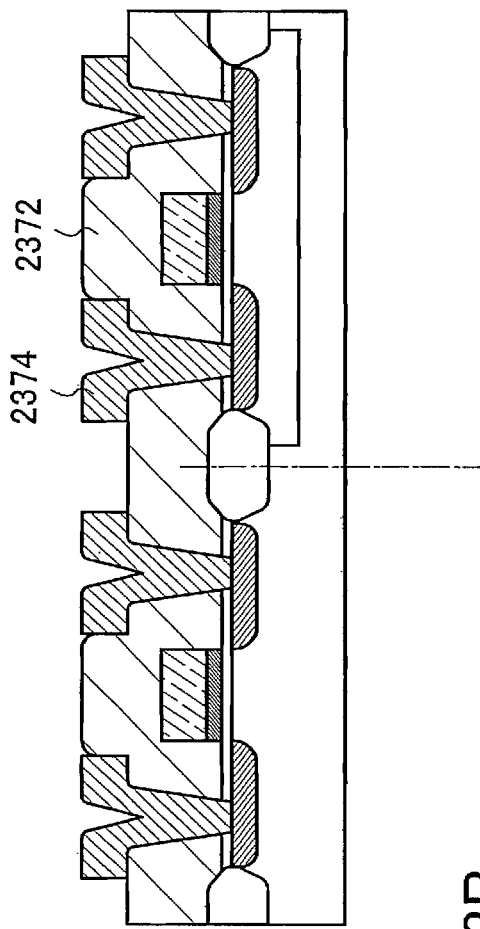
FIGS. 13A and 13B are diagrams showing a manufacturing method of a semiconductor device of the present invention.

Next, a second insulating film 2372 is formed so as to cover the insulating films 2332 and 2334 and the gate electrodes 2340 and 2342. Then, wirings 2374, which are electrically connected to the impurity regions 2352 and 2370 formed in the regions 2306 and 2304 respectively, are formed over the second insulating film 2372 (see FIG. 13A).

The second insulating film 2372 can be formed with a single layer or a stacked layer of an insulating film containing oxygen and/or nitrogen such as silicon oxide, silicon nitride, silicon oxynitride, or silicon nitride oxide; a film containing carbon such as DLC (Diamond-Like Carbon); an organic material such as epoxy, polyimide, polyamide, polyvinyl phenol, benzocyclobutene, or acrylic; or a siloxane material such as a siloxane resin by a CVD method, a sputtering method or the like. A siloxane material corresponds to a material having a bond of Si—O—Si. Siloxane has a skeleton structure with the bond of silicon (Si) and oxygen (O). As a substituent of siloxane, an organic group containing at least hydrogen (e.g., an alkyl group or aromatic hydrocarbon) is used. Also, a fluoro group may be used as the substituent, or both a fluoro group and an organic group containing at least hydrogen may be used.

The wirings 2374 are formed with a single layer or a stacked layer of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), and silicon (Si), or an alloy material or a compound material containing such an element as its main component by a CVD method, a sputtering method, or the like. An alloy material containing aluminum as its main component corresponds to, for example, a material which contains aluminum as its main component and also contains nickel, or a material which contains aluminum as its main component and also contains nickel and one or both of carbon and silicon. The wirings 2374 are preferably formed to have a stacked structure of a barrier film, an aluminum silicon (Al—Si) film, and a barrier film or a stacked structure of a barrier film, an aluminum silicon (Al—Si) film, a titanium nitride film, and a barrier film. It is to be noted that the "barrier film" corresponds to a thin film formed of titanium, titanium nitride, molybdenum, or molybdenum nitride. Aluminum and aluminum silicon are suitable materials for forming the wirings 2374 because they have high resistance values and are inexpensive. When barrier layers are provided as the top layer and the bottom layer, generation of hillocks of aluminum or aluminum silicon can be prevented. When a barrier film is formed of titanium which is an element having a high reducing property, even if a thin natural oxide film is formed on the crystalline semiconductor film, the natural oxide film can be reduced, and a favorable contact between the wirings 2374 and the crystalline semiconductor film can be obtained.

It is to be noted that the structure of transistors of the present invention is not limited to the one shown in the drawing. For example, a transistor with an inverted staggered structure, a FinFET structure, or the like can be used. A FinFET structure is preferable because it can suppress a short channel effect which occurs along with reduction in transistor size.

Figure 13B:
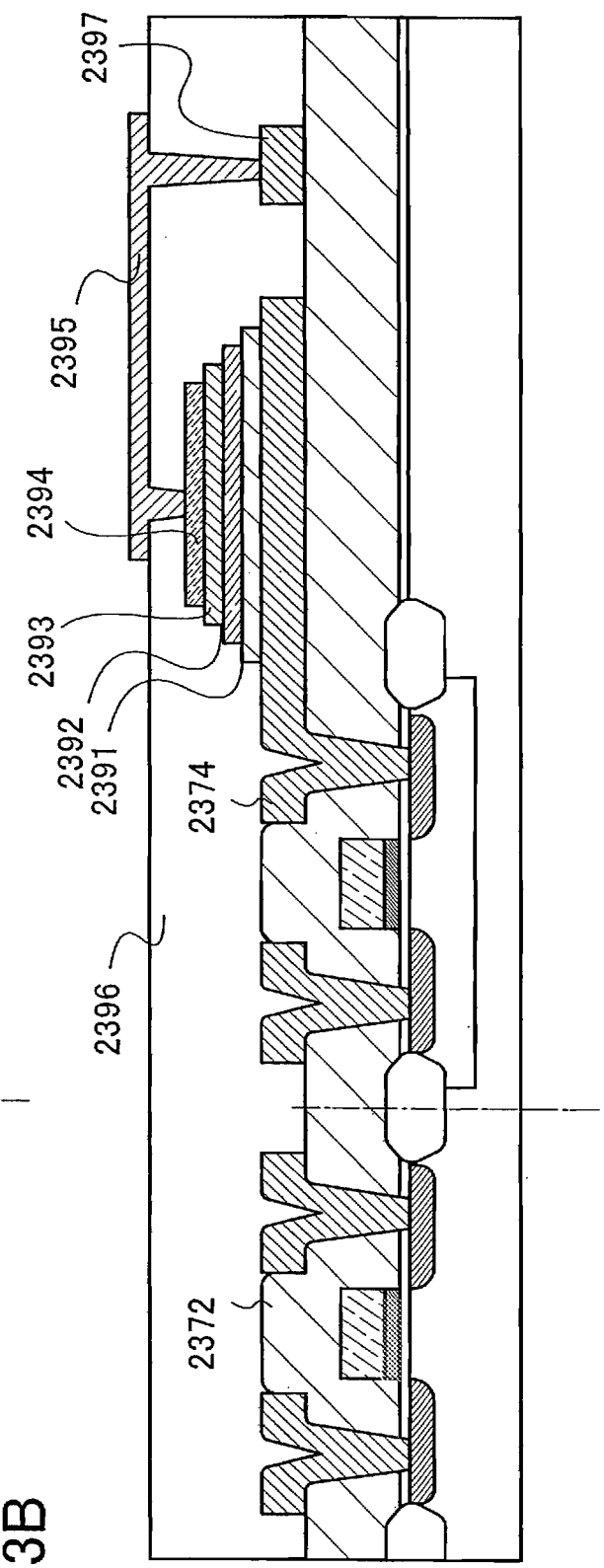

In this embodiment mode, the secondary battery is stacked over the wiring 2374 connected to the transistor. The secondary battery has a structure in which a current-collecting thin film, a negative electrode active material layer, a solid electrolyte layer, a positive electrode active material layer, and a current-collecting thin film are sequentially stacked (see FIG. 13B). Therefore, the material of the wiring 2374 which also has a function of the current-collecting thin film of the secondary battery should have high adhesion to the negative electrode active material layer and also low resistance. In particular, aluminum, copper, nickel, vanadium, or the like is preferably used.

Subsequently, the structure of the thin-film secondary battery is described. A negative electrode active material layer 2391 is formed over the wiring 2374. In general, vanadium oxide ($V_2O_5$) or the like is used. Next, a solid electrolyte layer 2392 is formed over the negative electrode active material layer 2391. In general, lithium phosphate ($Li_3PO_4$) or the like is used. Next, a positive electrode active material layer 2393 is formed over the solid electrolyte layer 2392. In general, lithium manganate ($LiMn_2O_4$) or the like is used. Lithium cobaltate ($LiCoO_2$) or lithium nickel oxide ($LiNiO_2$) may also be used. Next, a current-collecting thin film 2394 to serve as an electrode is formed over the positive electrode active material layer 2393. The current-collecting thin film 2394 should have high adhesion to the positive electrode active material layer 2393 and also low resistance. For example, aluminum, copper, nickel, vanadium, or the like can be used.

Each of the above-described thin layers of the negative electrode active material layer 2391, the solid electrolyte layer 2392, the positive electrode active material layer 2393, and the current-collecting thin film 2394 may be formed by a sputtering technique or an evaporation technique. In addition, the thickness of each layer is preferably 0.1 to 3 μm.

Next, an interlayer film 2396 is formed by application of a resin. The interlayer film 2396 is etched to form a contact hole. The interlayer film is not limited to a resin, and other films such as an oxide film formed by CVD method or the like may also be used; however, a resin is preferably used in terms of flatness. In addition, the contact hole may be formed without etching, but using a photosensitive resin. Next, a wiring layer 2395 is formed over the interlayer film 2396 and connected to a wiring 2397. Thus, an electrical connection of the secondary battery is secured.

With the above-described structure, the semiconductor device of the present invention can have a structure in which transistors are formed on a single crystal substrate and a thin-film secondary battery is formed thereover. Therefore, the semiconductor device of the present invention can achieve flexibility as well as reductions in thickness and size.

The method for manufacturing the semiconductor device in this embodiment mode can be applied to any of the semiconductor devices in the other embodiment modes.

This application is based on Japanese Patent Application serial No. 2006-349191 filed in Japan Patent Office on Dec. 26, 2006, the entire contents of which are hereby incorporated by reference.

What is claimed is:

1. A semiconductor device comprising:
    a memory cell array comprising a memory cell and a spare memory cell, the memory cell comprising a first transistor;
    a decoder electrically connected to the memory cell and the spare memory cell; and
    a data holding circuit electrically connected to the decoder, the data holding circuit comprising a second transistor,
    wherein the spare memory cell is configured to operate in accordance with an output from the data holding circuit,
    wherein the data holding circuit comprises a switch and a latch,
    wherein the switch is electrically connected to a first power supply line and supplied with power through the first power supply line, and
    wherein the latch is electrically connected to a second power supply line and supplied with power through the second power supply line.

2. The semiconductor device according to claim 1 further comprises a battery configured to supply power to the data holding circuit through the second power supply line,
    wherein the battery comprises an antenna circuit, a rectifying circuit and a power storage circuit, and
    wherein the battery is configured to charge the power storage circuit with power received wirelessly from an outside through the antenna circuit.

3. The semiconductor device according to claim 2, wherein the power storage circuit is a secondary battery or a capacitor.

4. The semiconductor device according to claim 3, wherein the secondary battery comprises a current-collecting thin film, a negative electrode active material layer, a solid electrolyte layer, and a positive electrode active material layer.

5. The semiconductor device according to claim 1, wherein each of the memory cell and the spare memory cell is an SRAM.

6. The semiconductor device according to claim 1,
    wherein the first transistor and the second transistor are formed on the same substrate.

7. A semiconductor device comprising:
    a memory cell array comprising a memory cell and a spare memory cell, the memory cell comprising a first transistor;
    a decoder electrically connected to the memory cell through a word line and electrically connected to the spare memory cell through a spare memory word line;
    a read/write circuit electrically connected to the memory cell and the spare memory cell through a bit line; and
    a data holding circuit electrically connected to the decoder, the data holding circuit comprising a second transistor,
    wherein the spare memory cell is configured to operate in accordance with an output from the data holding circuit,
    wherein the data holding circuit comprises an analog switch and a latch,
    wherein the analog switch is electrically connected to a first power supply line and supplied with power through the first power supply line, and
    wherein the latch is electrically connected to a second power supply line and supplied with power through the second power supply line.

8. The semiconductor device according to claim 7 further comprises a battery configured to supply power to the data holding circuit through the second power supply line, wherein the battery comprises an antenna circuit, a rectifying circuit and a power storage circuit, and wherein the battery is configured to charge the power storage circuit with power received wirelessly from an outside through the antenna circuit.

9. The semiconductor device according to claim 8, wherein the power storage circuit is a secondary battery or a capacitor.

10. The semiconductor device according to claim 9, wherein the secondary battery comprises a current-collecting thin film, a negative electrode active material layer, a solid electrolyte layer, and a positive electrode active material layer.

11. The semiconductor device according to claim 7, wherein each of the memory cell and the spare memory cell is an SRAM.

12. The semiconductor device according to claim 7, wherein the first transistor and the second transistor are formed on the same substrate.

13. A semiconductor device comprising:
a memory cell array comprising a memory cell and a spare memory cell, the memory cell comprising a first transistor;
a decoder electrically connected to the memory cell and the spare memory cell; and
a data holding circuit electrically connected to the decoder, the data holding circuit comprising a second transistor;
wherein the spare memory cell is configured to operate in accordance with an output from the data holding circuit,
wherein the data holding circuit comprises a clocked inverter and a latch,
wherein the clocked inverter is electrically connected to a first power supply line and supplied with power through the first power supply line, and wherein the latch is electrically connected to a second power supply line and supplied with power through the second power supply line.

14. The semiconductor device according to claim 13 further comprises a battery configured to supply power to the data holding circuit through the second power supply line, wherein the battery comprises an antenna circuit, a rectifying circuit and a power storage circuit, and wherein the battery is configured to charge the power storage circuit with power received wirelessly from an outside through the antenna circuit.

15. The semiconductor device according to claim 14, wherein the power storage circuit is a secondary battery or a capacitor.

16. The semiconductor device according to claim 15, wherein the secondary battery comprises a current-collecting thin film, a negative electrode active material layer, a solid electrolyte layer, and a positive electrode active material layer.

17. The semiconductor device according to claim 13, wherein each of the memory cell and the spare memory cell is an SRAM.

18. The semiconductor device according to claim 13, wherein the data holding circuit further comprises a second latch, wherein the second latch is electrically connected to the first power supply line and supplied with power through the first power supply line.

19. The semiconductor device according to claim 13, wherein the first transistor and the second transistor are formed on the same substrate.

* * * * *